United States Patent
Hong et al.

(10) Patent No.: US 9,431,341 B2
(45) Date of Patent: Aug. 30, 2016

(54) SEMICONDUCTOR DEVICE HAVING METAL PATTERNS AND PIEZOELECTRIC PATTERNS

(71) Applicant: Samsung Electronics Co., Ltd., Suwon-si, Gyeonggi-do (KR)

(72) Inventors: Yi-Koan Hong, Suwon-si (KR); Byung-Lyul Park, Seoul (KR); Ji-Soon Park, Suwon-si (KR); Si-Young Choi, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/329,749

(22) Filed: Jul. 11, 2014

(65) Prior Publication Data

US 2015/0137325 A1 May 21, 2015

(30) Foreign Application Priority Data

Nov. 15, 2013 (KR) ........................ 10-2013-0139140

(51) Int. Cl.
| | |
|---|---|
| *H01L 29/40* | (2006.01) |
| *H01L 23/528* | (2006.01) |
| *H01L 23/48* | (2006.01) |
| *H01L 25/065* | (2006.01) |

(52) U.S. Cl.
CPC ........... *H01L 23/528* (2013.01); *H01L 23/481* (2013.01); *H01L 25/0657* (2013.01); *H01L 2224/05572* (2013.01); *H01L 2224/05647* (2013.01); *H01L 2224/08146* (2013.01); *H01L 2224/80894* (2013.01); *H01L 2225/06513* (2013.01); *H01L 2225/06541* (2013.01); *H01L 2924/12041* (2013.01); *H01L 2924/12044* (2013.01)

(58) Field of Classification Search
None
See application file for complete search history.

(56) References Cited

U.S. PATENT DOCUMENTS

| | | | |
|---|---|---|---|
| 6,541,898 B2 | 4/2003 | Kitajima et al. | |
| 7,019,231 B2* | 3/2006 | Ishikawa | B81B 3/0051 200/61.45 R |
| 2012/0261801 A1* | 10/2012 | Takano | C25D 1/003 257/621 |

FOREIGN PATENT DOCUMENTS

| | | |
|---|---|---|
| JP | 2010186813 A | 8/2010 |
| JP | 2011066201 A | 3/2011 |
| KR | 100980455 B1 | 9/2010 |

OTHER PUBLICATIONS

Lee et al., "Improved All-Silicon Microcantilever Heaters With Integrated Piezoresistive Sensing," Journal of Microelectromechanical Systems, vol. 17, No. 2, Apr. 2008.

* cited by examiner

*Primary Examiner* — Sonya D McCall Shepard
(74) *Attorney, Agent, or Firm* — Renaissance IP Law Group LLP

(57) ABSTRACT

Provided is a semiconductor device. The semiconductor device includes a passivation layer defining a metal pattern on a first surface of a substrate, an inter-layer insulating layer disposed on a second surface of the substrate, and a piezoelectric pattern formed between the metal pattern and the passivation layer on the first surface of the substrate. A through-silicon-via and/or a pad can be directly bonded to another through-silicon-via and/or another pad by applying pressure only, and without performing a heat process.

20 Claims, 46 Drawing Sheets

US 9,431,341 B2

SEMICONDUCTOR DEVICE HAVING METAL PATTERNS AND PIEZOELECTRIC PATTERNS

CROSS-REFERENCE TO RELATED APPLICATION

This application claims priority under 35 U.S.C. §119 to Korean Patent Application No. 10-2013-0139140 filed on Nov. 15, 2013, the disclosure of which is hereby incorporated by reference in its entirety.

BACKGROUND

1. Field

Embodiments of the inventive concept relate to a semiconductor device including a metal pattern and a piezoelectric pattern.

2. Description of Related Art

Methods for fabricating highly integrated semiconductor devices by forming a metal pattern on the semiconductor device, and directly connecting or bonding the metal patterns to each other, have been provided. Conventionally, a process of connecting or bonding the metal patterns to each other requires the semiconductor device to be heated at a high temperature. However, since the heat process may mechanically, physically, chemically, or electrically damage or break circuit patterns due to a heat budget exerted on fine circuit patterns of the semiconductor device, the conventional approach is problematic.

SUMMARY

Embodiments of the inventive concept provide a semiconductor device including a piezoelectric pattern.

Other embodiments of the inventive concept provide a method of fabricating a semiconductor device including a piezoelectric pattern.

In still other embodiments of the inventive concept provide a semiconductor device capable of bonding through-silicon-vias and/or pads, with no heat process.

In still other embodiments of the inventive concept provide bonding structures of semiconductor devices including piezoelectric patterns.

The technical aspects of the inventive concept are not limited to the above disclosure. Other inventive aspects may become apparent to those of ordinary skill in the art based on the following descriptions.

In accordance with an aspect of the inventive concept, a semiconductor device includes a passivation layer defining a metal pattern on a first surface of a substrate, an inter-layer insulating layer disposed on a second surface of the substrate, and a piezoelectric pattern formed between the metal pattern and the passivation layer on the first surface of the substrate.

In accordance with another aspect of the inventive concept, a semiconductor device includes a first passivation layer disposed on a first surface of a substrate, a second passivation layer disposed on a second surface of the substrate, a through-via structure vertically passing through the substrate and the first passivation layer, and a piezoelectric pattern formed between the through-via structure and the second passivation layer.

In accordance with another aspect of the inventive concept, a semiconductor device may include a front-side passivation layer disposed on a first surface of a substrate, a back-side passivation layer disposed on a second surface of the substrate, a through-via structure vertically passing through the substrate and the back-side passivation layer, a first piezoelectric pattern formed between the through-via structure and the back-side passivation layer, a pad structure formed on the first surface of the substrate, a wrapping layer formed on the front-side passivation layer, and a second piezoelectric pattern formed on the front-side passivation layer. The second piezoelectric pattern may be further formed between side surfaces of the pad structure and the wrapping layer.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
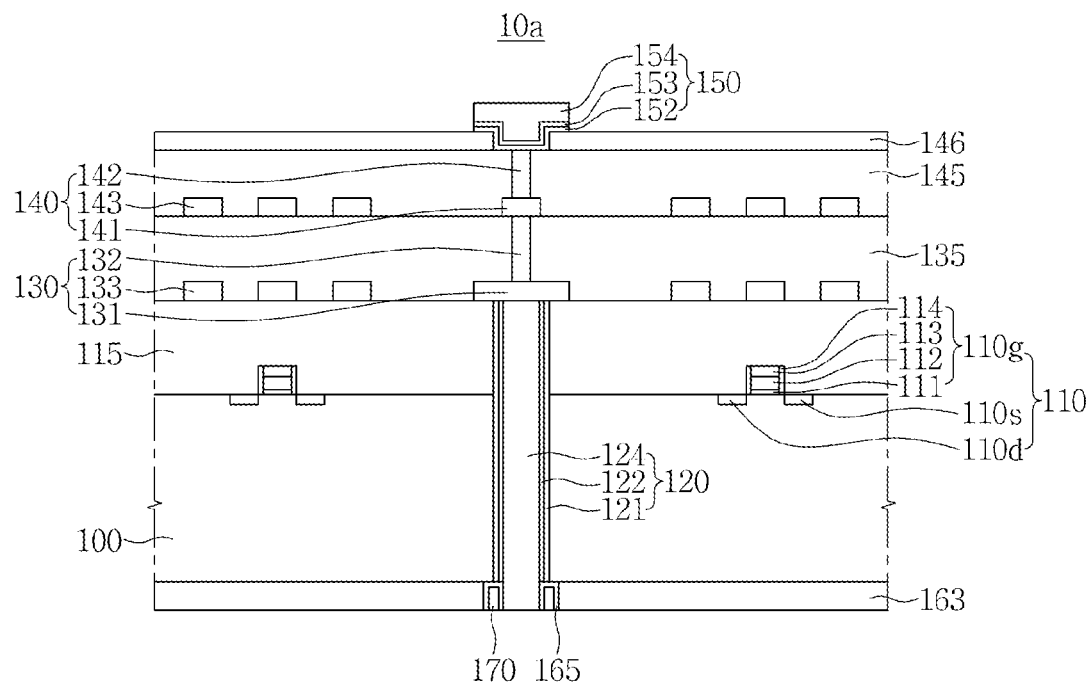
FIGS. 1A to 1F, and FIGS. 2A to 2C are vertical cross-sectional views for describing semiconductor devices in accordance with various embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional illustrations that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

FIGS. 1A to 1F are vertical cross-sectional views showing semiconductor devices 10a to 10f in accordance with various embodiments of the inventive concept.

Referring to FIG. 1A, a semiconductor device 10a in accordance with an embodiment of the inventive concept may include a substrate 100, a transistor 110, a lower inter-layer insulating layer 115, a lower metal interconnection 130, an intermediate inter-layer insulating layer 135, an upper metal interconnection 140, an upper inter-layer insulating layer 145, a front-side passivation layer 146, and a pad structure 150, which are formed on a first surface of the substrate 100. In addition, the semiconductor device 10a may include a through-silicon-via (TSV) structure 120 passing through the substrate 100. Moreover, the semiconductor device 10a may include a back-side passivation layer 163 and a back-side piezoelectric pattern 170, which are formed on a second surface of the substrate 100.

The substrate 100 may include a single-crystalline silicon bulk wafer, a compound semiconductor wafer, or a silicon-on-insulator (SOI) wafer.

The transistor 110 may include a gate stack 110g and source/drain areas 110s and 110d. The gate stack 110g may selectively include a stacked gate insulating layer 111, gate electrode 112, and gate capping layer 113, and/or a gate spacer 114 surrounding the gate insulating layer 111, the gate electrode 112, and/or the gate capping layer 113. The gate insulating layer 111 may include silicon oxide or a metal oxide. The gate electrode 112 may include a conductor, such as doped silicon, a silicide, a metal or a metal compound. The gate capping layer 113 may include silicon nitride. The gate spacer 114 may include silicon oxide and/or silicon nitride. The source/drain areas 110s and 110d may include at least one of boron (B), phosphorus (P), or arsenic (As) injected into the substrate 100. Otherwise, the source/drain areas 110s and 110d may include a metal silicide.

The lower inter-layer insulating layer 115 may be formed on the substrate 100 to cover the transistor 110. The lower inter-layer insulating layer 115 may include silicon oxide.

The lower metal interconnection 130 may include a through-silicon-via (TSV) pad 131, a lower via plug 132, and a lower metal line 133, which are formed on the lower inter-layer insulating layer 115. The TSV pad 131 may be vertically aligned with the TSV structure 120. The lower via plug 132 may be disposed on the TSV pad 131. In a plan view, the TSV pad 131 and the lower via plug 132 may have a circular or polygonal shape, and the lower metal line 133 may have a horizontally extending shape, such as a linear shape. As shown in FIG. 1A, in a vertical cross-sectional view or a side view, the lower via plug 132 may have the shape of a pillar vertically passing through the intermediate inter-layer insulating layer 135. The lower metal interconnection 130 may include one or more metals, such as tungsten (W), titanium (Ti), cobalt (Co), nickel (Ni), aluminum (Al), or copper (Cu).

The intermediate inter-layer insulating layer 135 may be formed on the lower inter-layer insulating layer 115 to cover the lower metal interconnection 130. The intermediate inter-layer insulating layer 135 may include a silicon oxide.

The upper metal interconnection 140 may include an inter-via pad 141, an upper via plug 142, and an upper metal line 143, which are formed on the intermediate inter-layer insulating layer 135. The inter-via pad 141 may be vertically aligned with the lower via plug 132. The upper via plug 142 may be disposed on the inter-via pad 141. In a plan view, the inter-via pad 141 and the upper via plug 142 may have a circular or polygonal shape, and the upper metal line 143 may have a horizontally extending in a line shape. As shown in FIG. 1A, in a cross-sectional view or a side view, the upper via plug 142 may have the shape of a pillar vertically passing through the upper inter-layer insulating layer 145. The upper metal interconnection 140 may include one or more metals, such as tungsten (W), titanium (Ti), cobalt (Co), aluminum (Al), or copper (Cu).

The upper inter-layer insulating layer 145 may be formed on the intermediate inter-layer insulating layer 135 to cover the upper metal interconnection 140. The upper inter-layer insulating layer 145 may include silicon oxide.

The front-side passivation layer 146 may be formed on the upper inter-layer insulating layer 145. The front-side passivation layer 146 may include silicon nitride, silicon oxide, and/or polyimide.

The pad structure 150 may be aligned with the upper via plug 142. A lower part of the pad structure 150 may vertically penetrate the front-side passivation layer 146 to be connected to the upper via plug 142. The pad structure 150 may include a pad bather layer 152, a pad seed layer 153, and a pad core 154. The pad barrier layer 152 may include one or more barrier metals or metal compounds, such as titanium (Ti), titanium nitride (TiN), tantalum (Ta), tantalum nitride (TaN), titanium tungsten (TiW), or tungsten nitride (WN). The pad seed layer 153 may include one or more seed metals, such as copper (Cu), tungsten (W), or nickel (Ni). The pad core 154 may have a mesa shape. The pad core 154 may include copper (Cu) or nickel (Ni). The pad seed layer 153 and the pad core 154 may include the same metal. In other embodiments, the pad seed layer 153 and the pad core 154 may include a different metal. Accordingly, a boundary between the pad seed layer 153 and the pad core 154 is indicated by a solid line. The pad structure 150 may protrude from the front-side passivation layer 146.

The back-side passivation layer 163 may be formed on a back-side of the substrate 100. The back-side passivation layer 163 may include silicon nitride, silicon oxide, and/or polyimide.

The TSV structure 120 may vertically penetrate the substrate 100, the lower inter-layer insulating layer 115, and the back-side passivation layer 163. An end portion of the TSV structure 120 may be exposed, and the other end portion of the TSV structure 120 may be in contact with the TSV pad 131. The TSV structure 120 may penetrate the lower inter-layer insulating layer 115 to be in contact with the TSV pad 131. The TSV structure 120 may include a TSV liner 121, a TSV barrier layer 122, and a TSV core 124. The TSV core 124 may have a circular or polygonal shape in a plan view, and a pillar shape in a vertical cross-sectional view. The TSV barrier layer 122 may be formed on a side surface of the TSV core 124 to surround the TSV core 124. The TSV liner 121 may be formed on an outer sidewall of the TSV barrier layer 122 to surround the TSV barrier layer 122. The TSV liner 121 may include an insulating layer, such as silicon oxide or silicon nitride. The TSV barrier layer 122 may include one or more barrier metal or metal compounds, such as titanium (Ti), titanium nitride (TiN), tantalum (Ta), tantalum nitride (TaN), titanium tungsten (TiW), or tungsten nitride (WN). The TSV core 124 may include copper (Cu).

The back-side piezoelectric pattern 170 may be formed on the back-side of the substrate 100 to surround side surfaces of the TSV structure 120. For example, the back-side piezoelectric pattern 170 may partially surround a side surface of an end portion of the TSV core 124. The back-side piezoelectric pattern 170, in a plan view or a top view, may have the shape of a disk or ring surrounding the TSV core 124.

Side and bottom surfaces of the back-side piezoelectric pattern 170 may be surrounded by a back-side lining layer 165. Side surfaces of the back-side lining layer 165 may be surrounded by the back-side passivation layer 163. For example, the back-side lining layer 165 may be interposed between the back-side piezoelectric pattern 170 and the back-side passivation layer 163. The back-side lining layer 165 may have a shape of a single or double disk, a double disk, or a concentric circle in a plan view or a top view, and a U-shape in a vertical cross-sectional view. The back-side lining layer 165 may include a low-k insulating material, such as BLACKDIAMOND (a trade name, manufactured by Applied Materials, Inc.), SiCHO, porous $SiO_2$, and/or SILK (a trade name, manufactured by Dow Chemical). In other embodiments, the back-side lining layer 165 may include silicon nitride. An end portion of the TSV structure 120, for example, an end surface of the TSV core 124 may be co-planar with a top surface of the back-side piezoelectric pattern 170. Moreover, the end surface of the TSV core 124 and the top surface of the back-side piezoelectric pattern 170 may be coplanar with a top surface of the back-side lining layer 165 and/or a top surface of the back-side passivation layer 163.

Figure 1B:
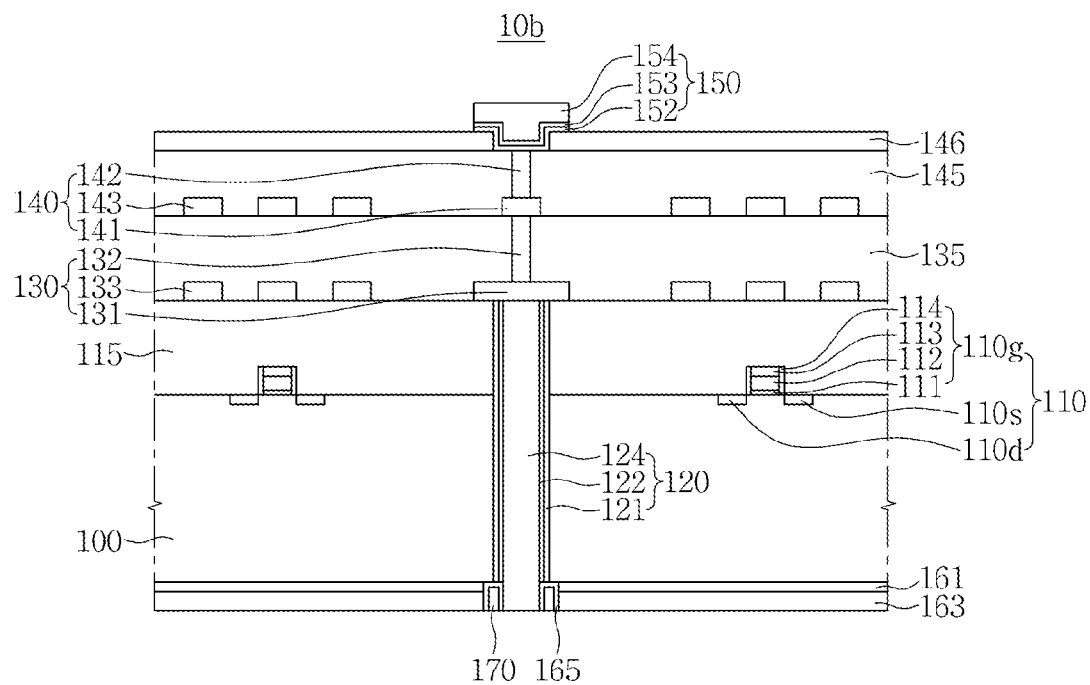

Referring to FIG. 1B, a semiconductor device 10b in accordance with an embodiment of the inventive concept may include a back-side buffer insulator 161. The back-side buffer insulator 161 may be interposed between a back-side of the substrate 100 and the back-side passivation layer 163. The back-side buffer insulator 161 may include silicon oxide and/or silicon nitride. The back-side buffer insulator 161 may partially surround a side surface of the back-side piezoelectric pattern 170. For example, the back-side buffer insulator 161 may be in contact with a part of a side surface of a back-side lining layer 165. Other elements of FIG. 1B are the same as or similar to elements of FIG. 1A, and therefore, a detailed description of such elements is not repeated.

Figure 1C:
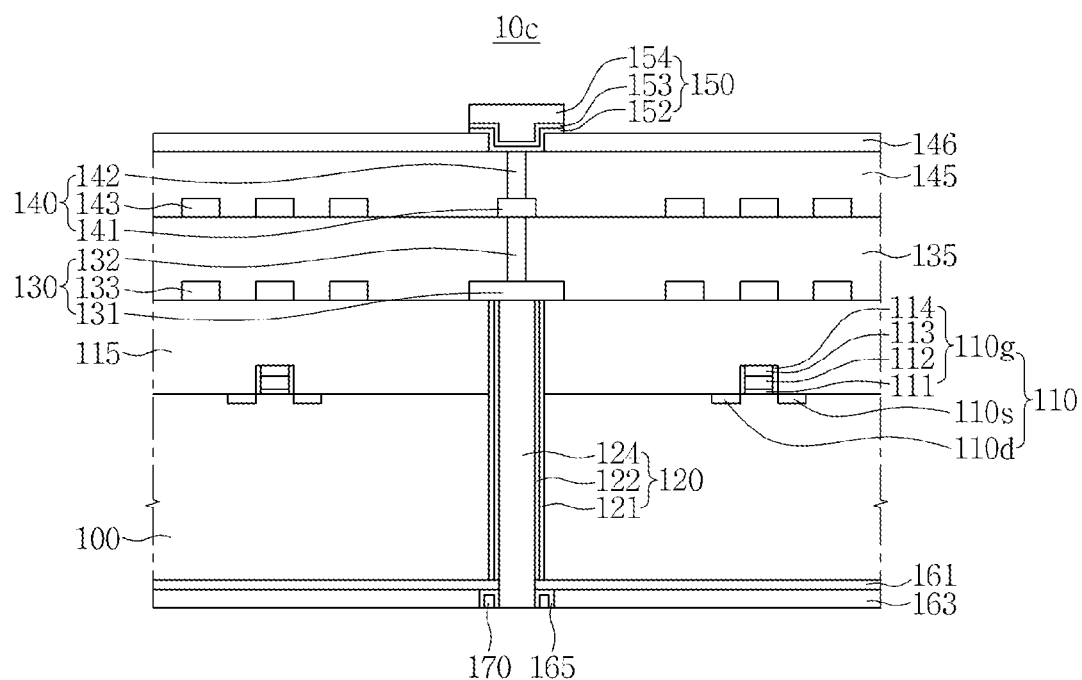

Referring to FIG. 1C, a semiconductor device 10c in accordance with an embodiment of the inventive concept may include a back-side buffer insulator 161. The back-side buffer insulator 161 may be interposed between a back-side of the substrate 100 and the back-side passivation layer 163. The back-side buffer insulator 161 may include silicon oxide and/or silicon nitride. At least portions of the back-side buffer insulator 161 may be interposed between the substrate 100 and the back-side piezoelectric pattern 170. For example, the back-side buffer insulator 161 may be in contact with a bottom surface, a side surface, and/or a top surface of a back-side lining layer 165. Other elements of FIG. 1C are the same as or similar to elements of FIG. 1A, and therefore, a detailed description of such elements is not repeated.

Figure 1D:
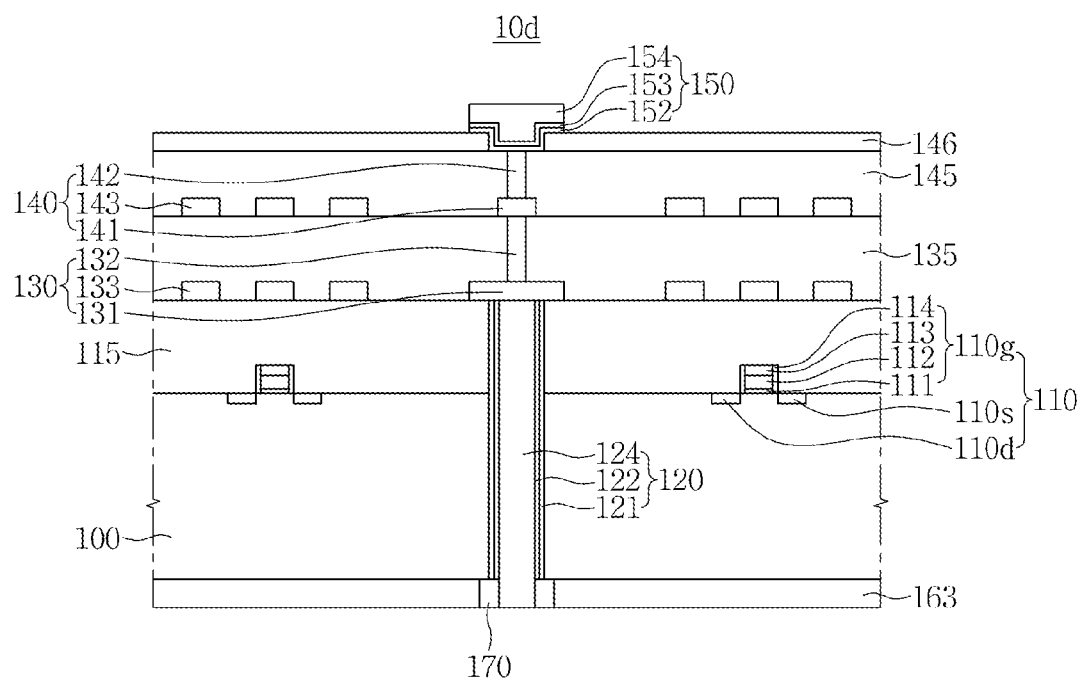

Referring to FIG. 1D, a semiconductor device 10d in accordance with an embodiment of the inventive concept need not include the back-side lining layer 165. Rather, the back-side passivation layer 163 may be in direct contact with side surfaces of the back-side piezoelectric pattern 170. The back-side piezoelectric pattern 170 may be in direct contact with the TSV structure 120. For example, parts of side surfaces of the TSV core 124 may be in direct contact with the back-side piezoelectric pattern 170. Other elements of FIG. 1D are the same as or similar to elements of FIG. 1A, and therefore, a detailed description of such elements is not repeated.

Figure 1E:
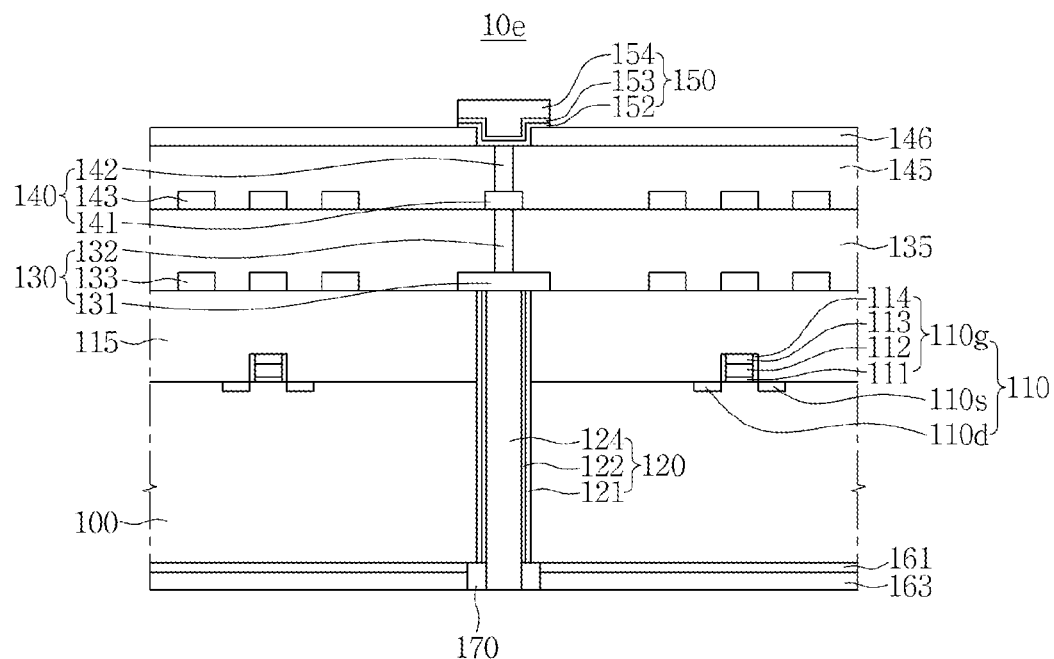

Referring to FIG. 1E, a semiconductor device 10e in accordance with an embodiment of the inventive concept may include a back-side buffer insulator 161, but need not include the back-side lining layer 165. The back-side buffer insulator 161 may be interposed between a back-side of the substrate 100 and the back-side passivation layer 163. The back-side buffer insulator 161 may include silicon oxide and/or silicon nitride. The back-side buffer insulator 161 may be in direct contact with the back-side piezoelectric pattern 170 to surround a part of a side surface thereof. Moreover, the back-side passivation layer 163 may be in direct contact with the back-side piezoelectric pattern 170 to surround another part of a side surface thereof. Other elements of FIG. 1E are the same as or similar to elements of FIG. 1A, and therefore, a detailed description of such elements is not repeated.

Figure 1F:
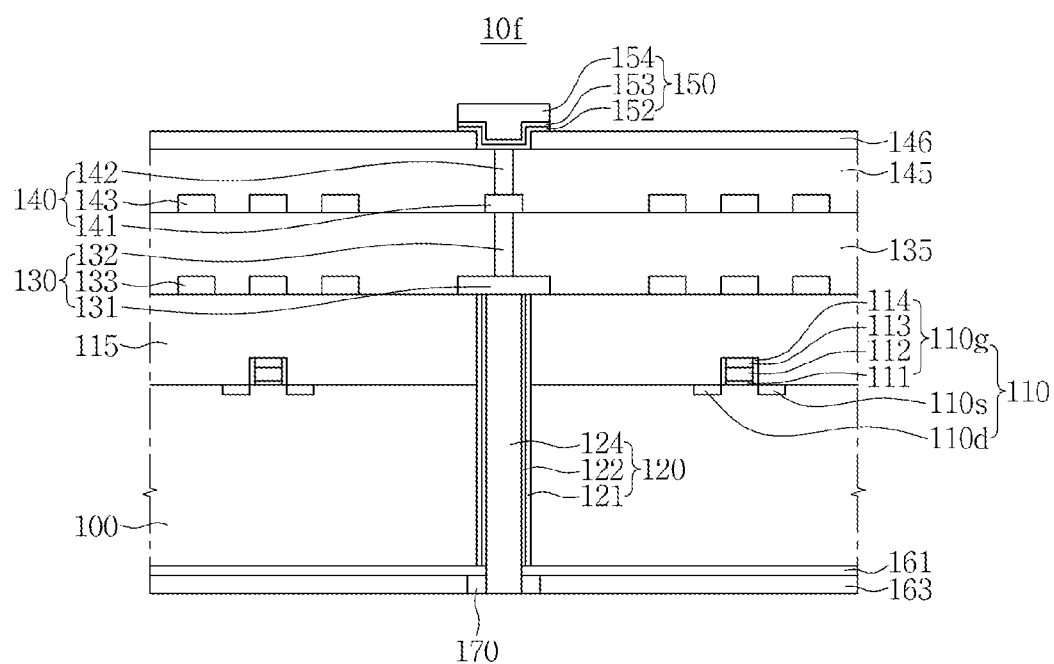

Referring to FIG. 1F, a semiconductor device 10f in accordance with an embodiment of the inventive concept may include a back-side buffer insulator 161, but need not include the back-side lining layer 165. The back-side buffer insulator 161 may be interposed between a back-side of the substrate 100 and the back-side passivation layer 163. The back-side buffer insulator 161 may include silicon oxide and/or silicon nitride. The back-side buffer insulator 161 may be interposed between the substrate 100 and the back-side piezoelectric pattern 170. For example, the back-side buffer insulator 161 may be in contact with a bottom surface, a side surface, and/or a top surface of the back-side piezoelectric pattern 170. Other elements of FIG. 1F are the same as or similar to elements of FIG. 1A, and therefore, a detailed description of such elements is not repeated.

In the semiconductor devices 10a to 10f in accordance with the various embodiments of the inventive concept, the TSV structure 120 can be bonded electrically and physically to another conductive element without causing damage by omitting a direct heat process and applying physical pressure on the back-side piezoelectric pattern 170. Accordingly, since there is no heat budget applied to internal circuit elements of the semiconductor devices 10a to 10f, the semiconductor devices 10a to 10f can be stably fabricated and operated.

Figure 2A:
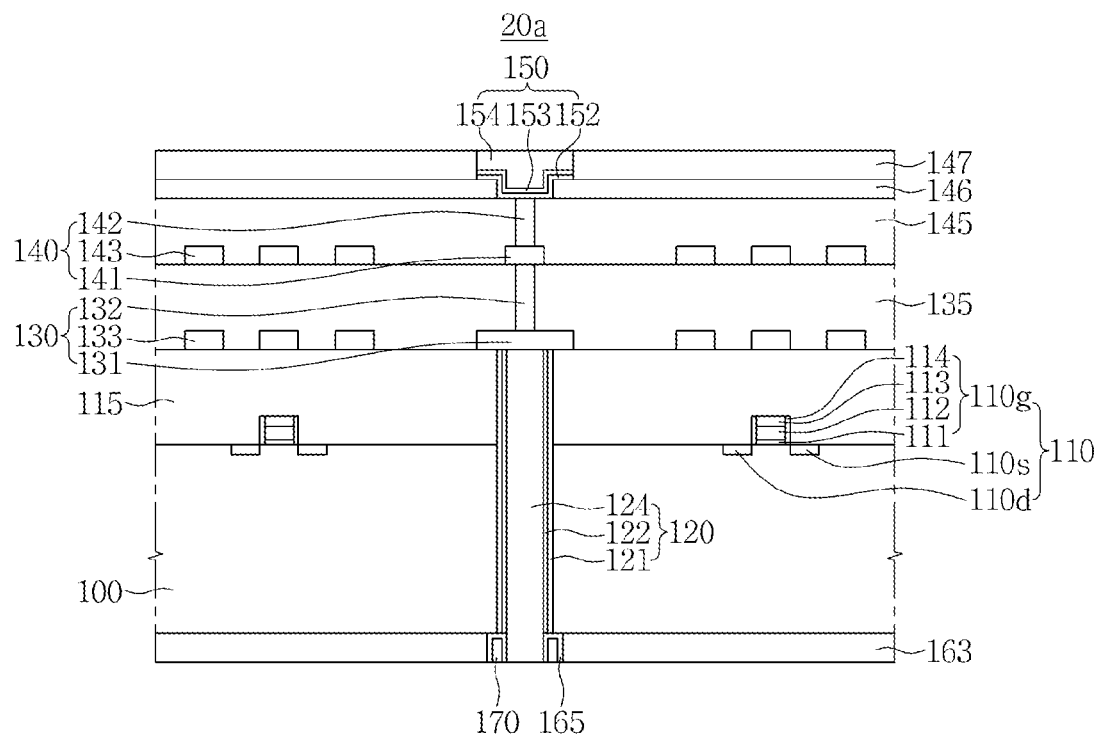
Figure 2B:
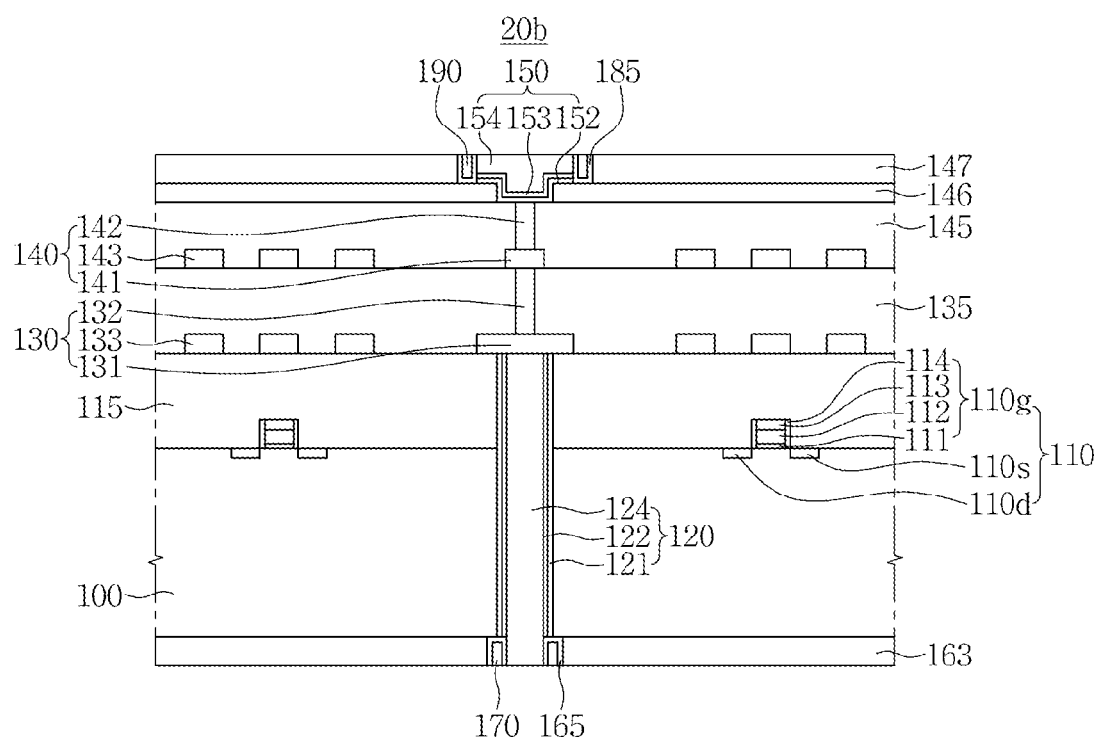
Figure 2C:
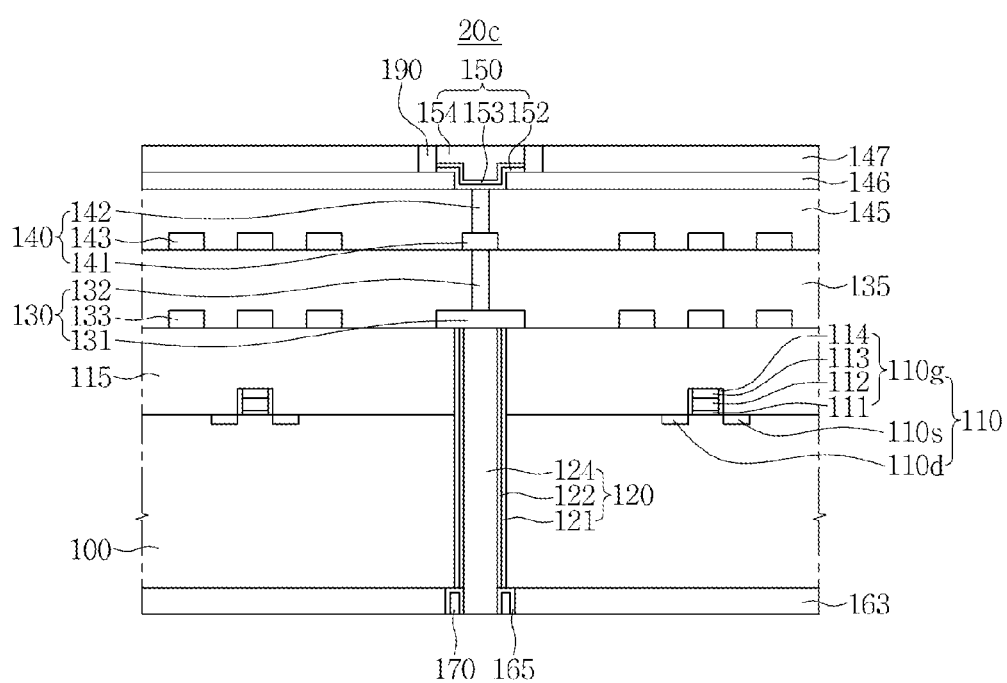
Figure 3A:
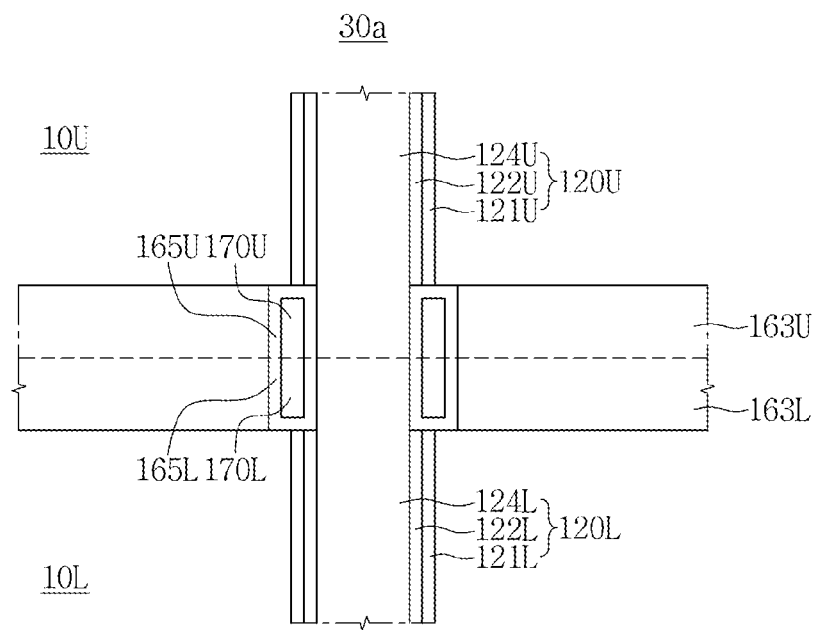
FIGS. 3A to 3F are schematic views illustrating bonding structures of various through-silicon-via structures in accordance with various embodiments of the inventive concept.
Figure 3B:
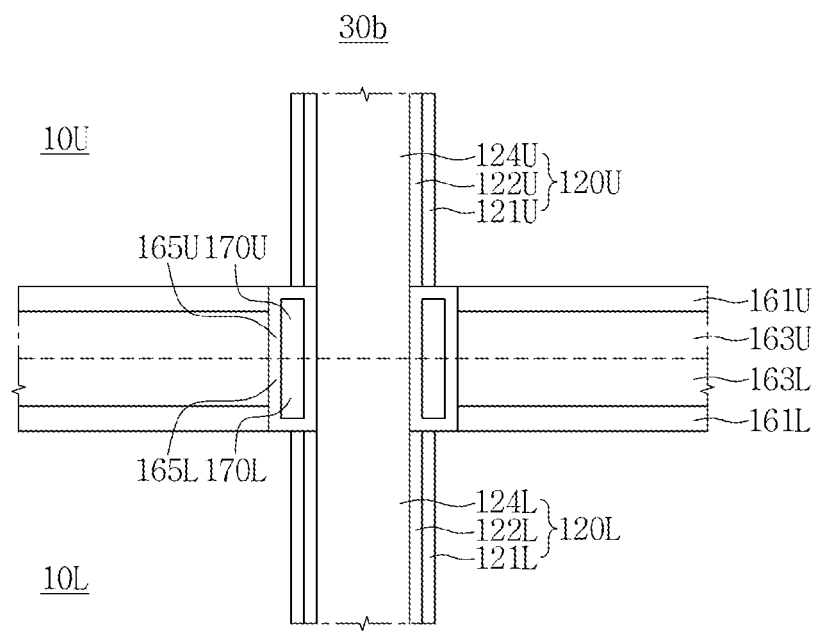
Figure 3C:
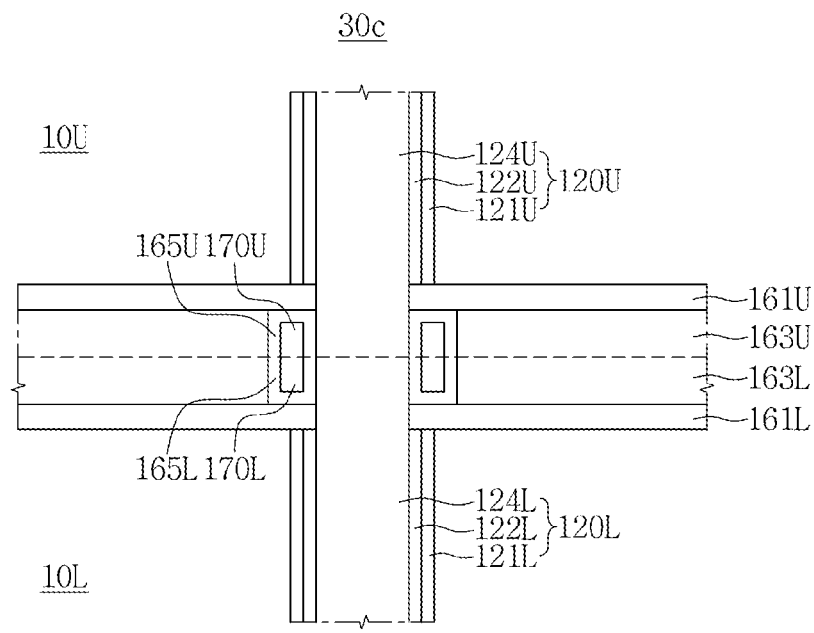
Figure 3D:
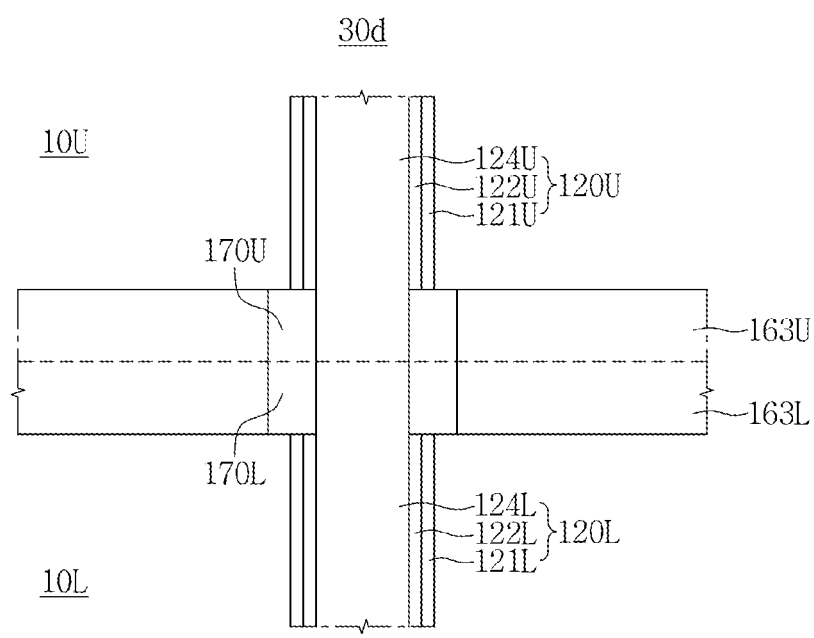
Figure 3E:
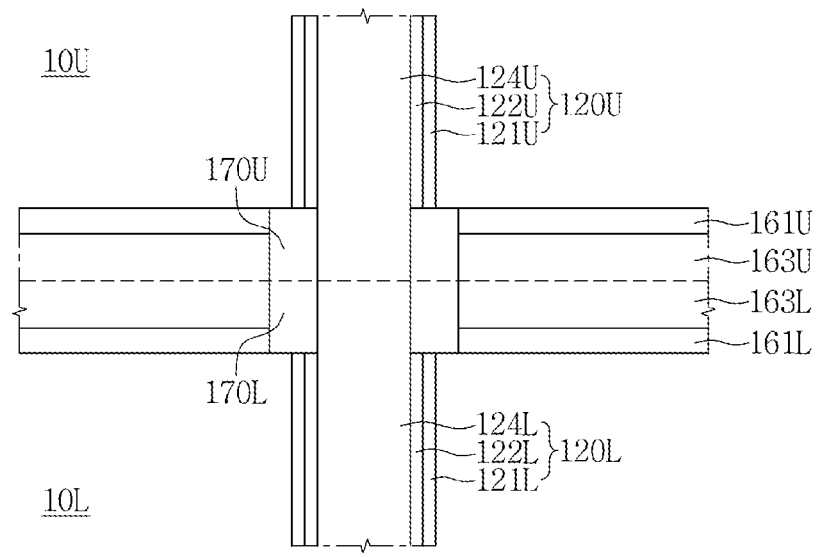
Figure 3F:
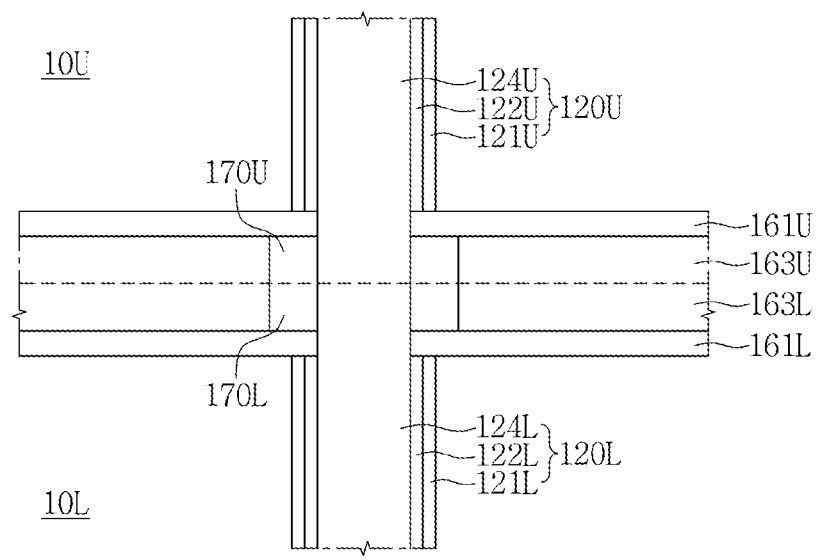
Figure 4A:
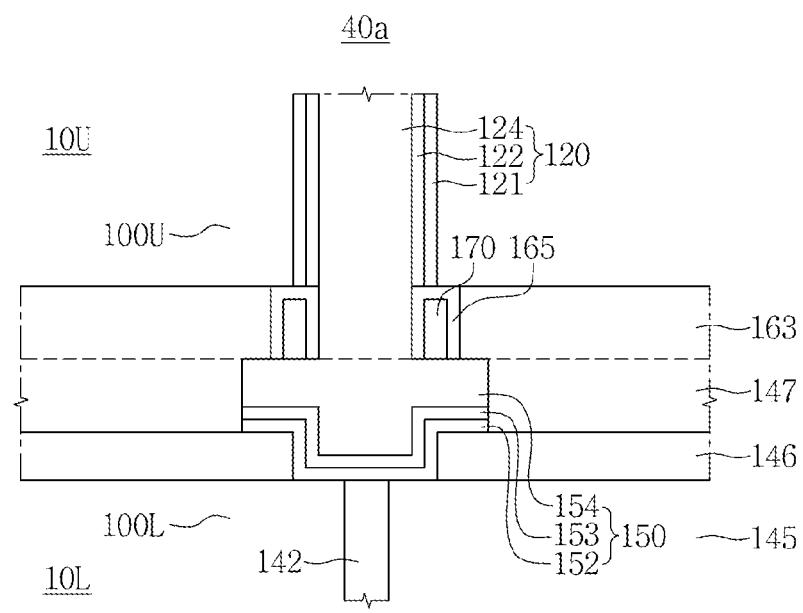
FIGS. 4A to 4F, and FIGS. 5A to 5R are schematic views illustrating bonding structures of through-silicon-via structures and pad structures in accordance with various embodiments of the inventive concept.
Figure 4B:
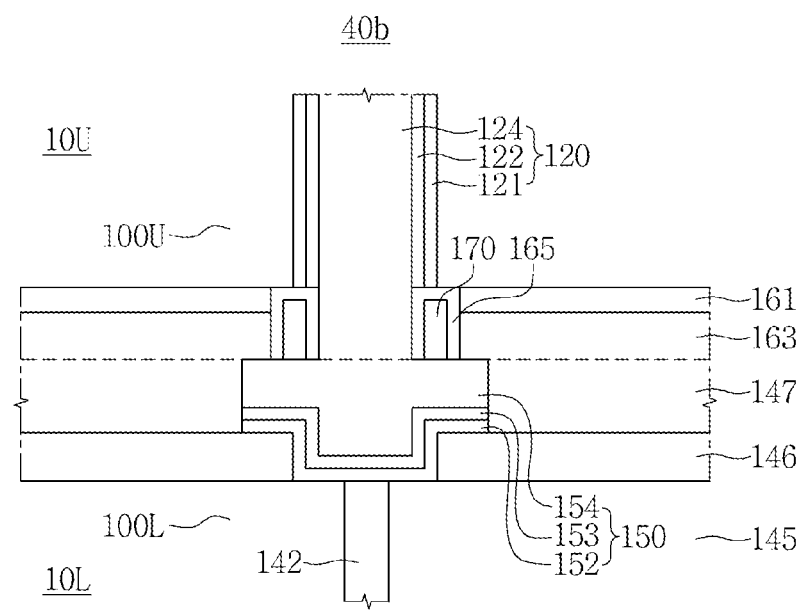
Figure 4C:
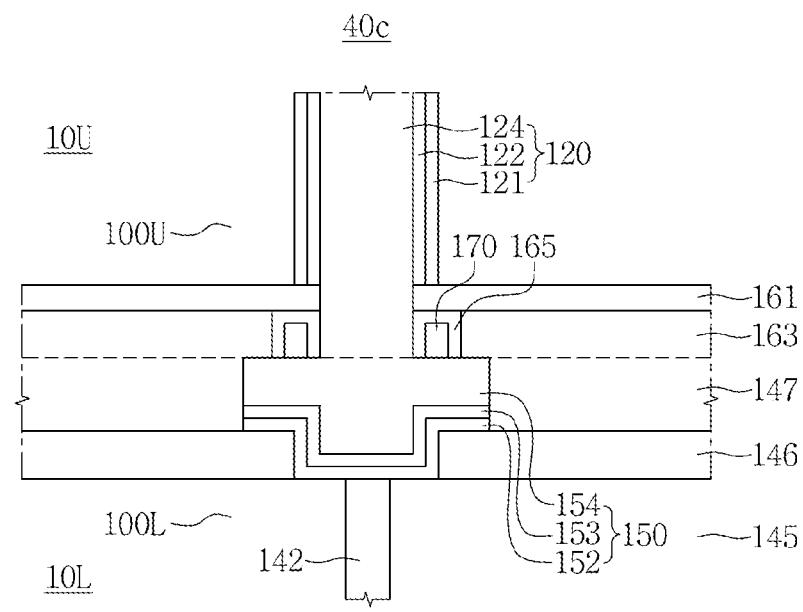
Figure 4D:
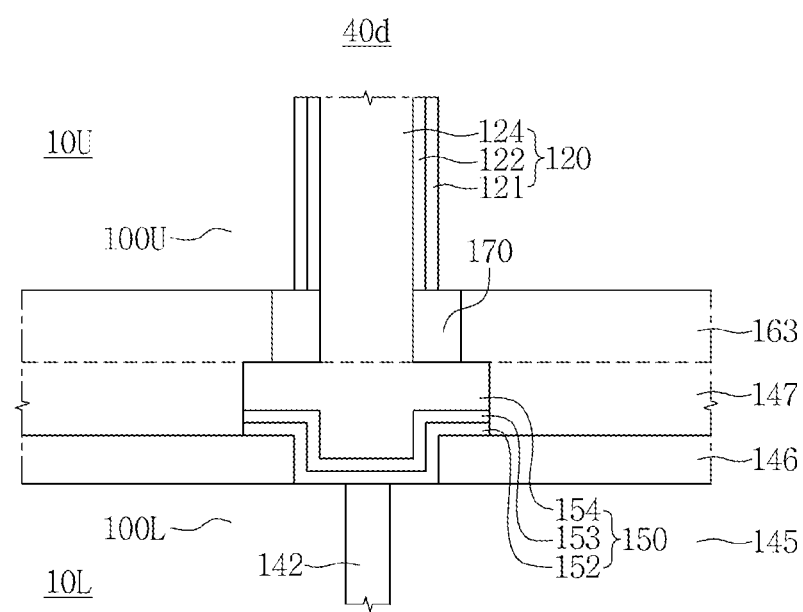
Figure 4E:
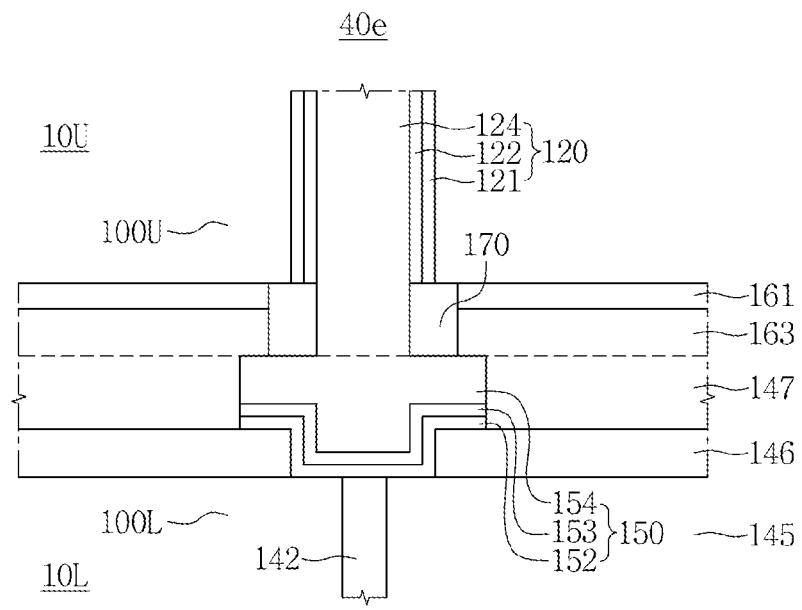
Figure 4F:
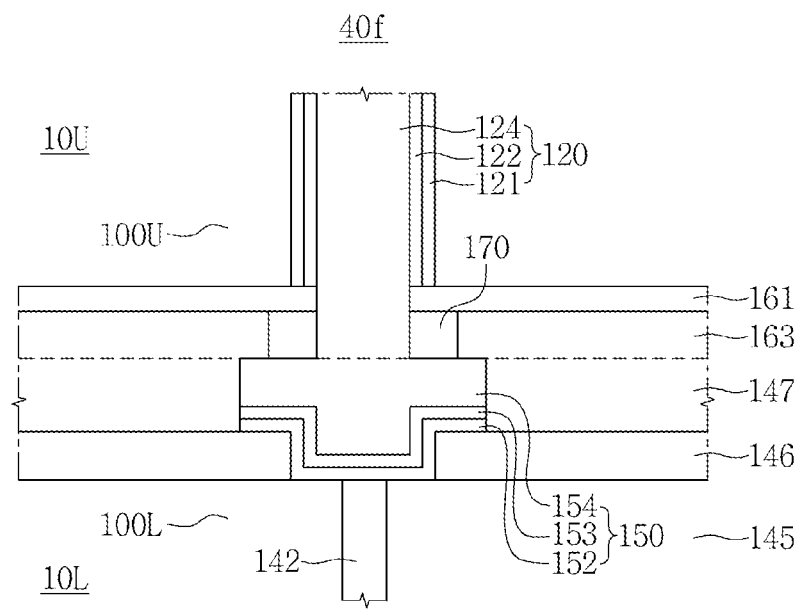

FIGS. 2A to 2C are vertical cross-sectional views showing semiconductor devices 20a to 20c in accordance with various embodiments of the inventive concept.

Referring to FIG. 2A, a semiconductor device 20a in accordance with an embodiment of the inventive concept may include a wrapping layer 147. The wrapping layer 147 may be formed on the front-side passivation layer 146 to surround side surfaces of the pad structure 150. The wrapping layer 147 may include silicon oxide, silicon nitride, and/or polyimide. Other elements of FIG. 2A are the same as or similar to elements of FIG. 1A, and therefore, a detailed description of such elements is not repeated.

Referring to FIG. 2B, a semiconductor device 20b in accordance with an embodiment of the inventive concept may include a wrapping layer 147 and a front-side piezoelectric pattern 190 disposed on the front-side passivation layer 146. The wrapping layer 147 may be formed on the front-side passivation layer 146 to surround side surfaces of the pad structure 150 and/or side surface of the front-side piezoelectric pattern 190.

The front-side piezoelectric pattern 190 may be formed on a front-side of the substrate 100 and/or the front-side passivation layer 146 to surround side surfaces of the pad structure 150. The front-side piezoelectric pattern 190 may have a disk shape or a ring shape in a plan view or a top view.

Side and bottom surfaces of the front-side piezoelectric pattern 190 may be surrounded by a front-side lining layer 185. Side surfaces of the front-side lining layer 185 may be surrounded by the wrapping layer 147. For example, a front-side lining layer 185 may be interposed between the front-side piezoelectric pattern 190 and the wrapping layer 147. A bottom surface of the front-side lining layer 185 may be in contact with the front-side passivation layer 146. The front-side lining layer 185 may have a single or double disk or a ring shape in a plan view or a top view, and a U shape in a vertical cross-sectional view. The front-side lining layer 185 may include a low-k insulating material, such as BLACKDIAMOND (a trade name, manufactured by Applied Materials, Inc.), SiCHO, porous $SiO_2$, and/or SILK (a trade name, Dow Chemical). In other embodiments, the front-side lining layer 185 may include silicon nitride.

Other elements of FIG. 2B are the same as or similar to elements of FIG. 1A, and therefore, a detailed description of such elements is not repeated.

Referring to FIG. 2C, a semiconductor device 20c in accordance with an embodiment of the inventive concept may include a wrapping layer 147 and a front-side piezoelectric pattern 190 disposed on the front-side passivation layer 146. The front-side piezoelectric pattern 190 may be formed on the front-side passivation layer 146 to directly surround side surfaces of the pad structure 150 and/or side surface of the front-side piezoelectric pattern 190. A bottom surface of the front-side piezoelectric pattern 190 may be in direct contact with the front-side passivation layer 146. The wrapping layer 147 may be formed on the front-side passivation layer 146 to directly surround side surfaces of the front-side piezoelectric pattern 190. Other elements of FIG. 2C are the same as or similar to elements of FIG. 1A, and therefore, a detailed description of such elements is not repeated.

Features of the back-side piezoelectric pattern 170 and back-side lining layers 165 of the semiconductor devices 10a to 10f illustrated and described in FIGS. 1A to 1F, and features of the front-side piezoelectric pattern 190 and front-side lining layers 185 of the semiconductor devices 20a to 20c illustrated and described in FIGS. 2A to 2C, can be combined in various ways. For example, the back-side piezoelectric pattern 170 and the back-side lining layer 165 illustrated in FIGS. 2A to 2C have the same shapes as those illustrated in FIG. 1A, but can be substituted by the features illustrated and described in FIGS. 1B to 1F. In other words, embodiments illustrated in FIGS. 2A to 2C can incorporate one or more features or elements from one or more embodiments illustrated in FIGS. 1B to 1F.

FIGS. 3A to 3F are schematic views illustrating various bonding structures 30a to 30f of TSV structures 120U and 120L in accordance with various embodiments of the inventive concept.

Referring to FIG. 3A to 3F, the bonding structures 30a to 30f in accordance with various embodiments of the inventive concept may each include, with reference further to FIGS. 1A to 1F, upper semiconductor devices 10U and lower semiconductor devices 10L, which may be bonded together. For example, the upper TSV structures 120U of the upper semiconductor devices 10U and lower TSV structures 120L of the lower semiconductor devices 10L may be directly bonded together.

The upper TSV structures 120U and the lower TSV structures 120L may respectively have a symmetrical shape or the same shape, and may be vertically aligned so as to be in direct contact with each other. In addition, upper back-side piezoelectric patterns 170U and lower back-side piezoelectric patterns 170L may be vertically aligned so as to be in direct contact with each other. Moreover, upper back-side lining layers 165U and lower back-side lining layers 165L may be vertically aligned so as to be in direct contact with each other. Since the same materials are in contact with each other, boundaries between the upper components 10U, 120U, 161U, 165U, and 170U and the lower components 10L, 120L, 161L, 165L, and 170L are indicated by dotted lines. The reference numerals of FIGS. 3A to 3F are the same as or similar to those of FIGS. 1A to 1F (e.g., 163U is similar to 163), and such sameness or similarity can indicate a correlation of the elements, layers, components, and the like. Therefore, a detailed description of such elements, layers, components, and the like, is not repeated.

FIGS. 4A to 4F are schematic views illustrating various bonding structures 40a to 40f of TSV structures 120 and pad structures 150 in accordance with various embodiments of the inventive concept.

Referring to FIGS. 4A to 4F, in the bonding structures 40a to 40f in accordance with various embodiments of the inventive concept, the TSV structures 120 and back-side piezoelectric patterns 170 of the semiconductor devices 10a to 10f, and the pad structures 150 of the semiconductor devices 10a to 10f, and 20a illustrated in FIGS. 1A to 1F, and 2A, may be directly bonded together. For example, the back-side piezoelectric patterns 170 may be disposed on the pad core 154 of the pad structure 150. Dotted lines represent that the same materials are in contact with each other, and solid lines represent that different materials may be in contact with each other. The reference numerals of FIGS. 4A to 4F are similar to or the same as those of FIGS. 1A to 1F, and such sameness or similarity can indicate a correlation of the elements, layers, components, and the like. Therefore, a detailed description of such elements, layers, components, and the like, is not repeated.

Figure 5A:
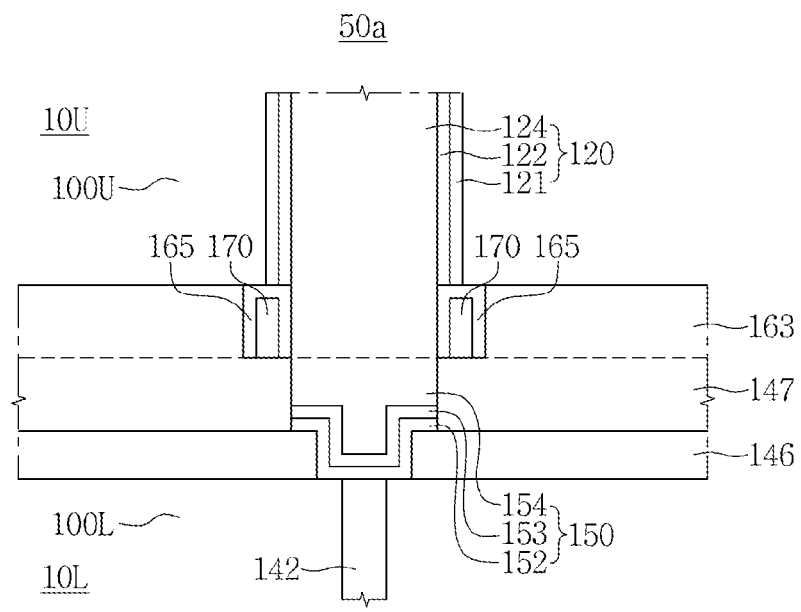
Figure 5B:
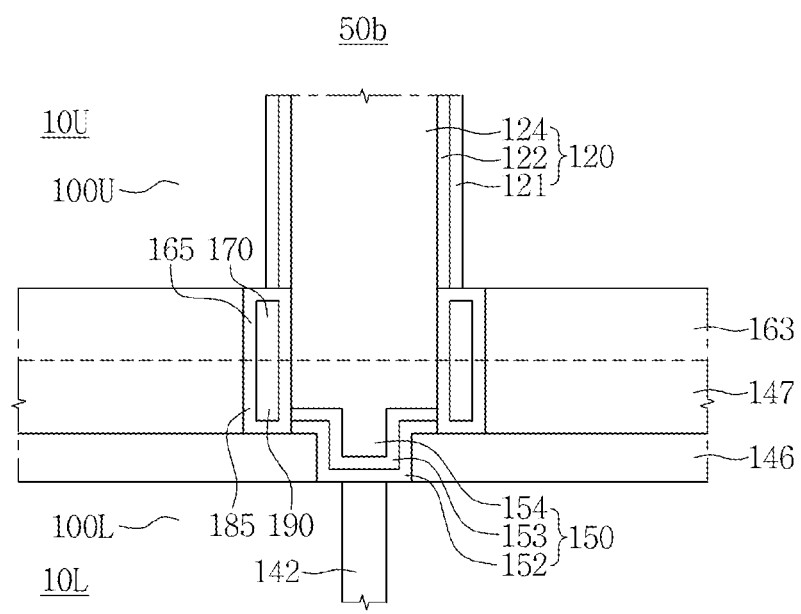
Figure 5C:
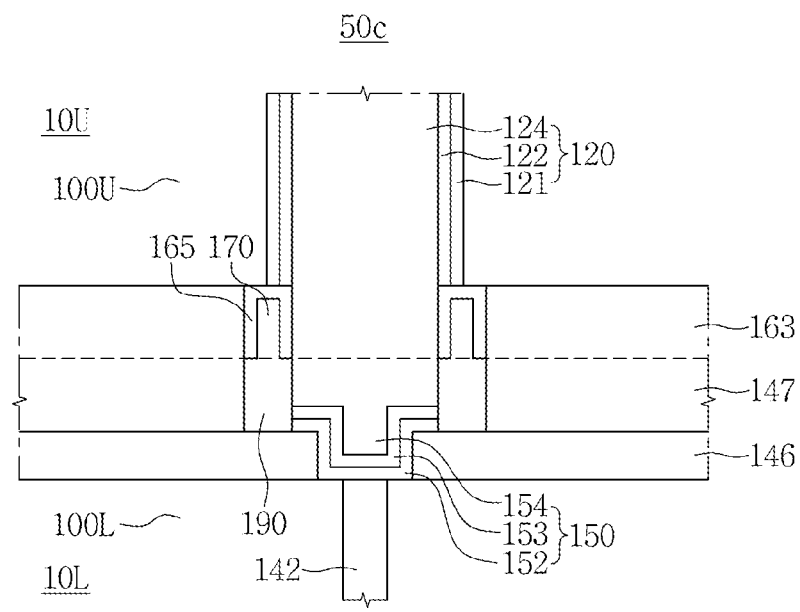
Figure 5D:
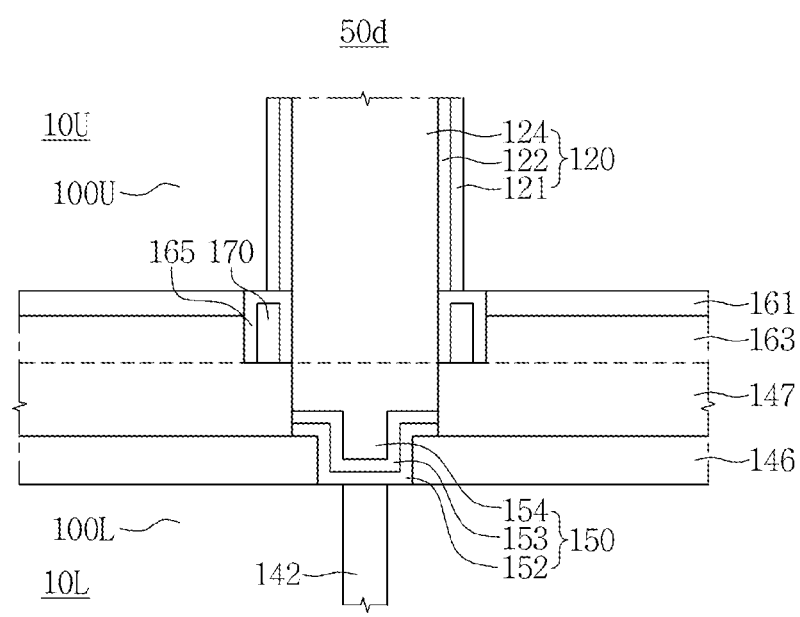
Figure 5E:
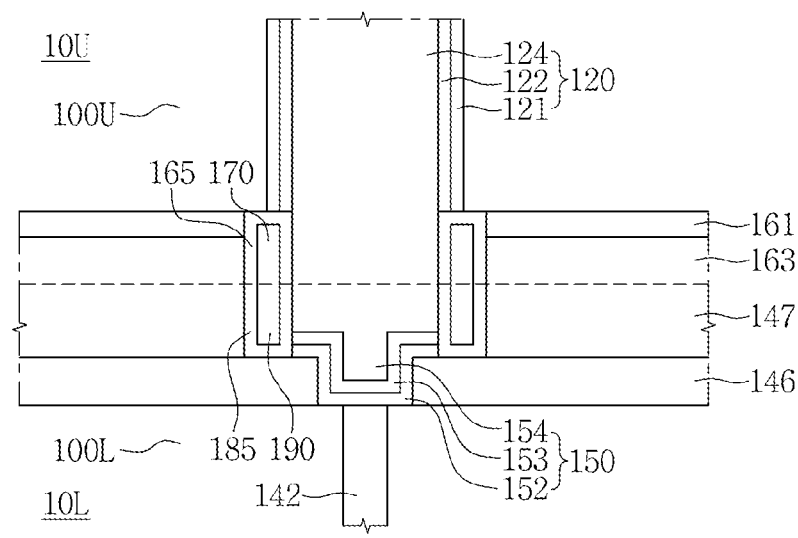
Figure 5F:
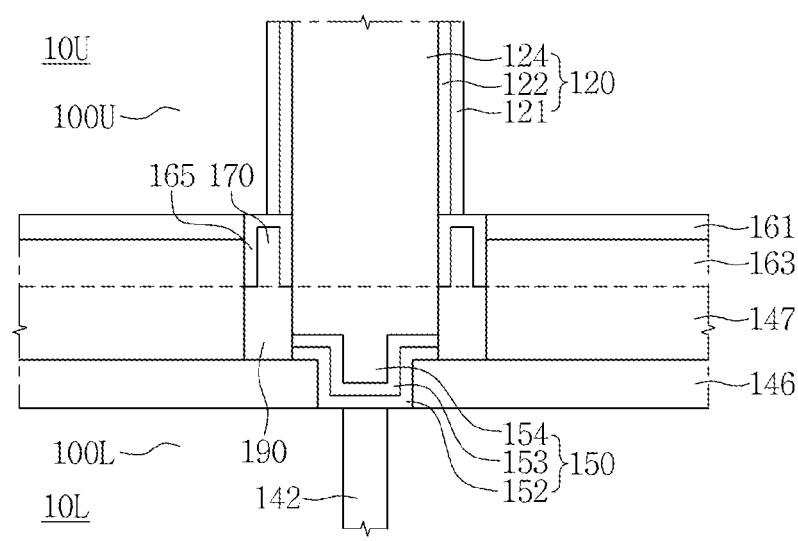
Figure 5G:
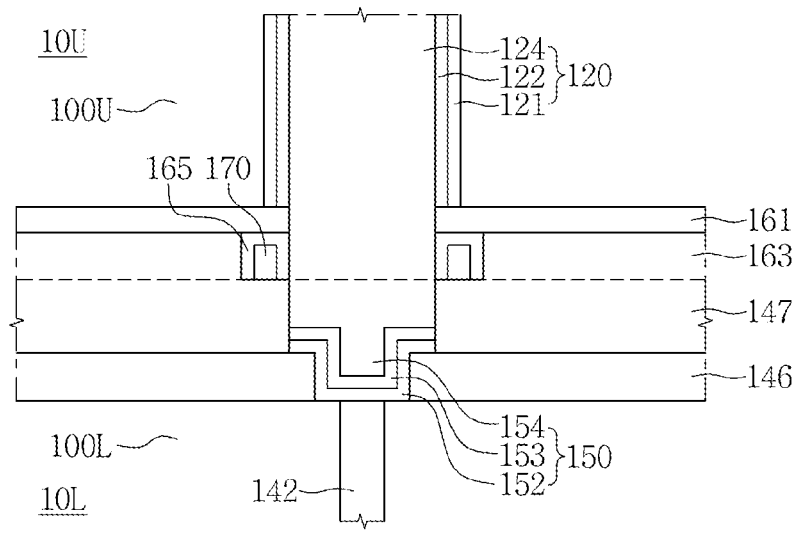
Figure 5H:
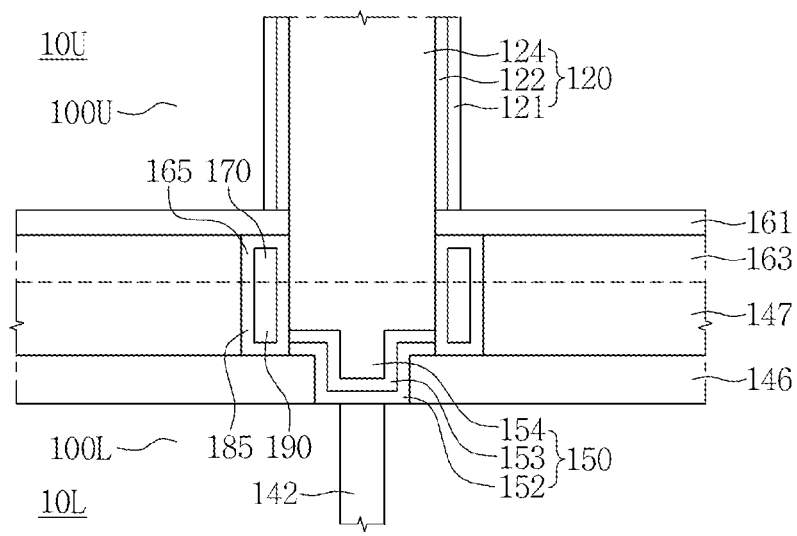
Figure 5I:
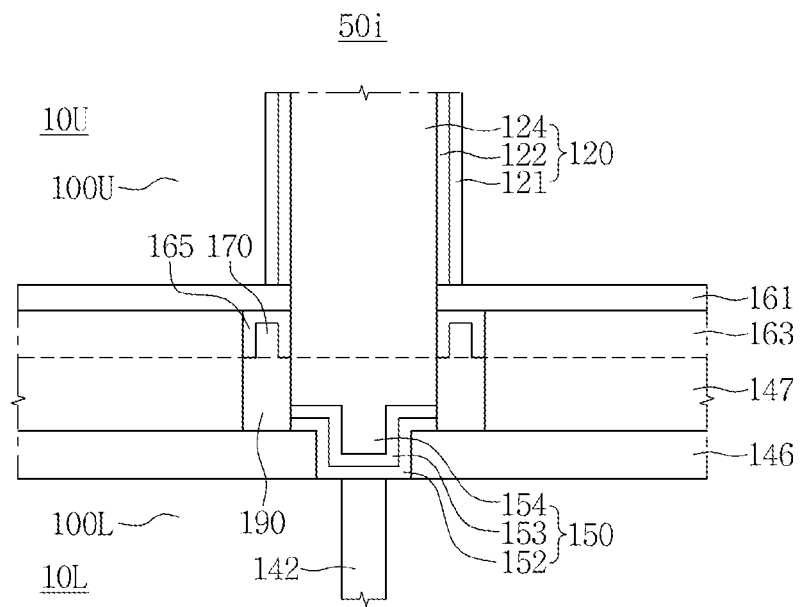
Figure 5J:
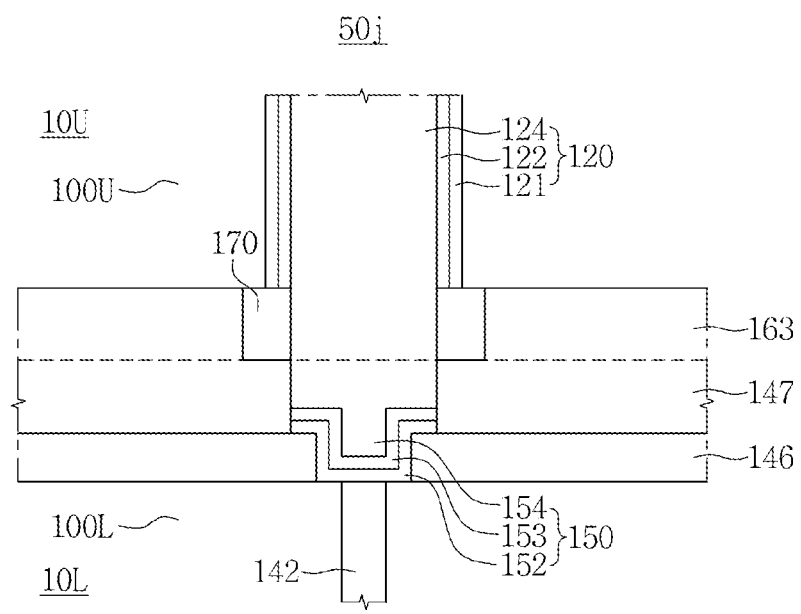
Figure 5K:
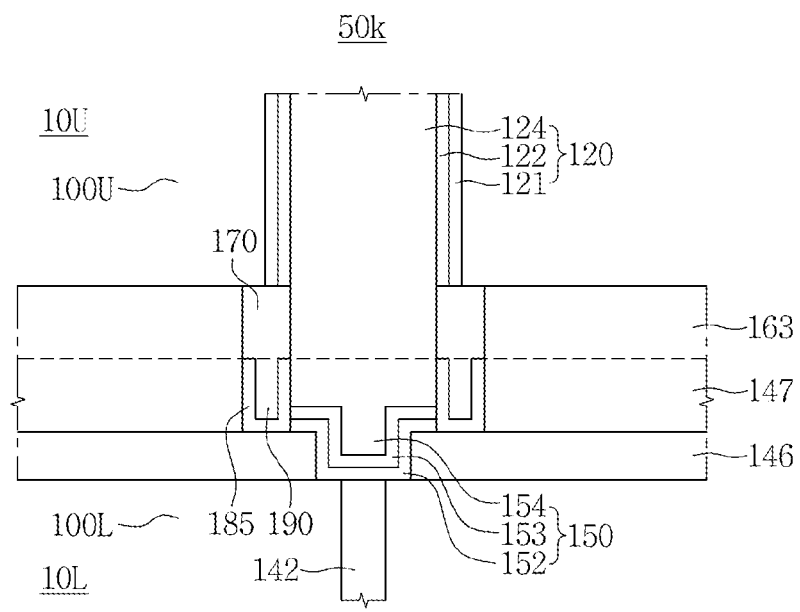
Figure 5L:
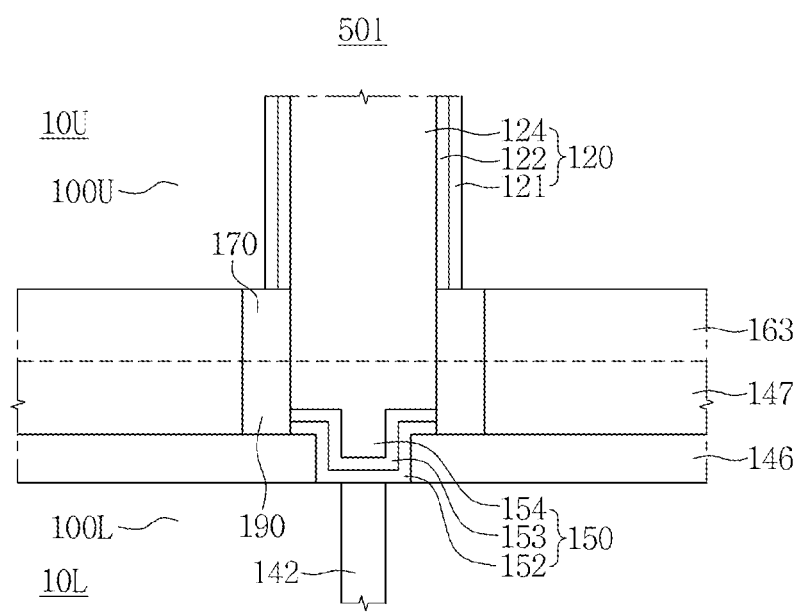
Figure 5M:
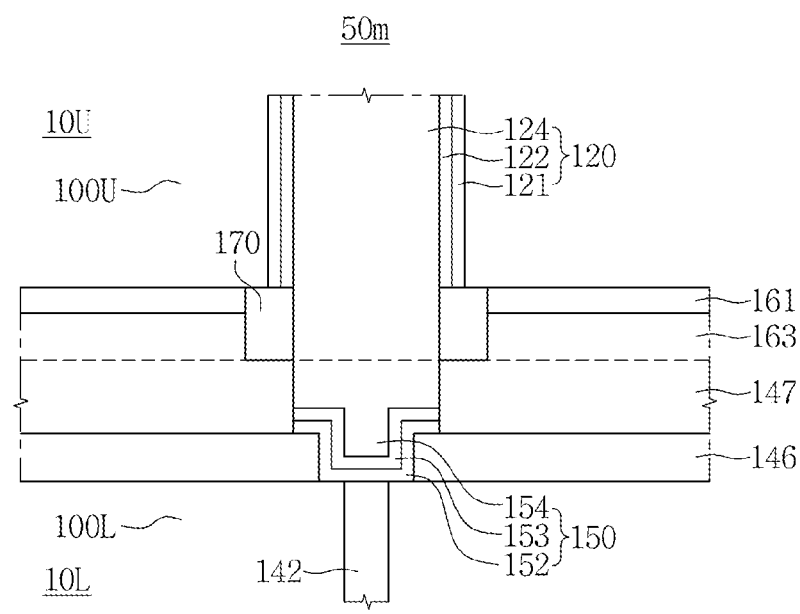
Figure 5N:
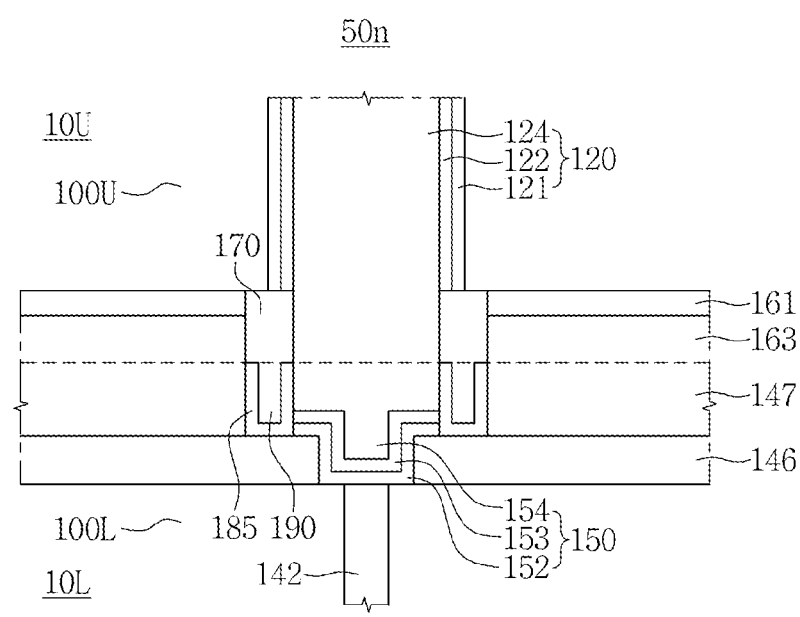
Figure 5O:
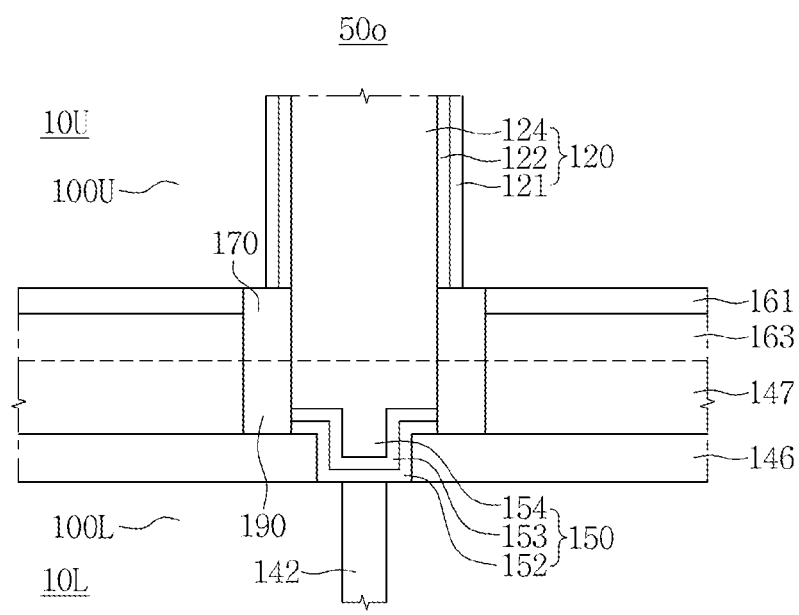
Figure 5P:
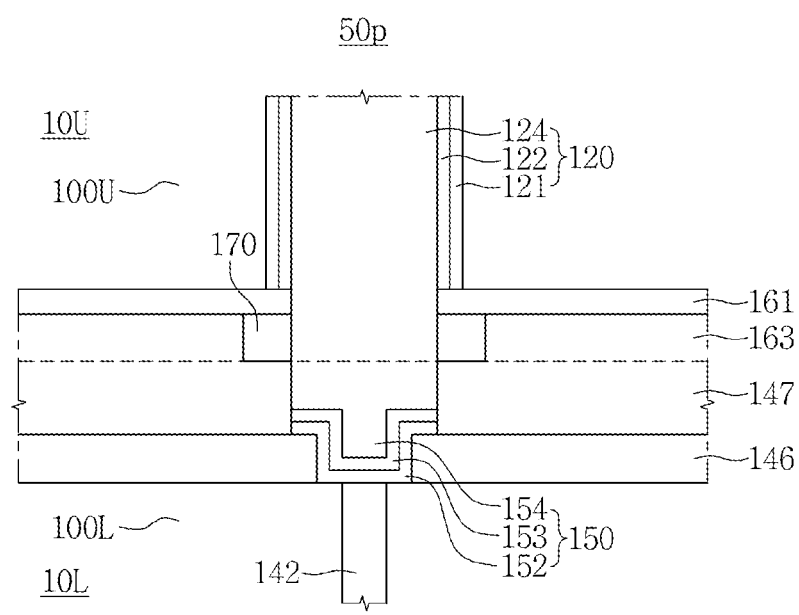
Figure 5Q:
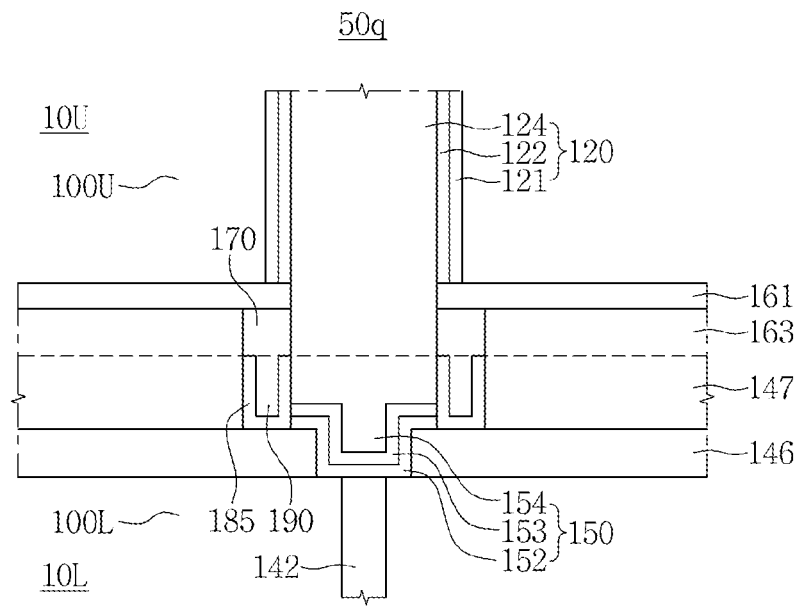
Figure 5R:
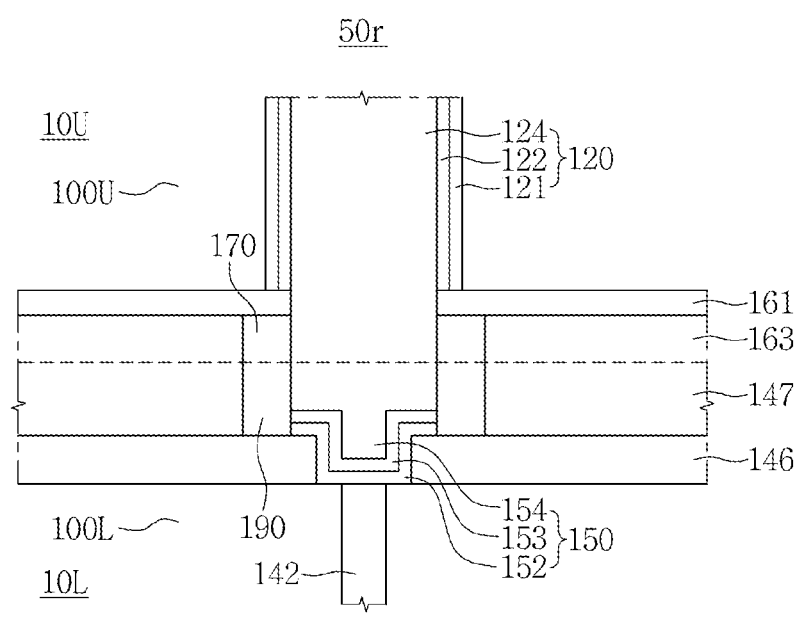

FIGS. 5A to 5R are schematic views illustrating various bonding structures 50a to 50r of TSV structures 120 and pad structures 150 in accordance with various embodiments of the inventive concept.

Referring to FIG. 5A to 5R, in the bonding structures 50a to 50r in accordance with various embodiments of the inventive concept, the TSV structures 120 and back-side piezoelectric patterns 170 of the semiconductor devices 10a to 10f illustrated in FIGS. 1A to 1F, and the pad structures 150 and front-side piezoelectric patterns 190 of the semiconductor devices 20a to 20c illustrated in FIGS. 2A to 2C, are bonded in various ways. The TSV structures 120 and the pad structures 150 are assumed and described as being vertically aligned with each other. For example, it is assumed and described that the TSV cores 124 of the TSV structures 120 are aligned with the pad cores 154 of the pad structures 150, and the back-side piezoelectric patterns 170 are aligned with the front-side piezoelectric patterns 190.

The reference numerals of FIGS. 5A to 5R are similar to or the same as those of FIGS. 1A to 1F and/or FIGS. 2A to 2C, and such sameness or similarity can indicate a correlation of the elements, layers, components, and the like. Therefore, a detailed description of such elements, layers, components, and the like, is not repeated.

Figure 6A:
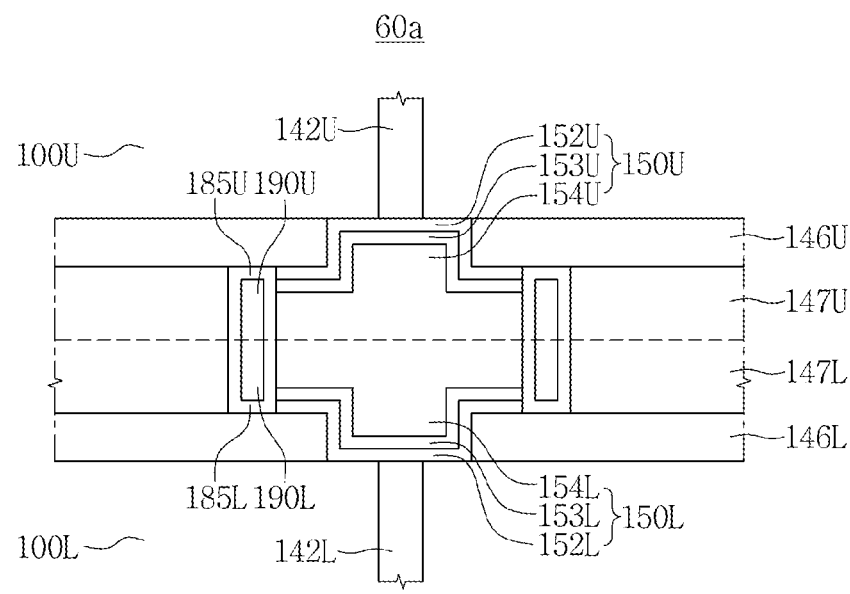
FIGS. 6A and 6B are schematic views illustrating bonding structures of pad structures in accordance with embodiments of the inventive concept.
Figure 6B:
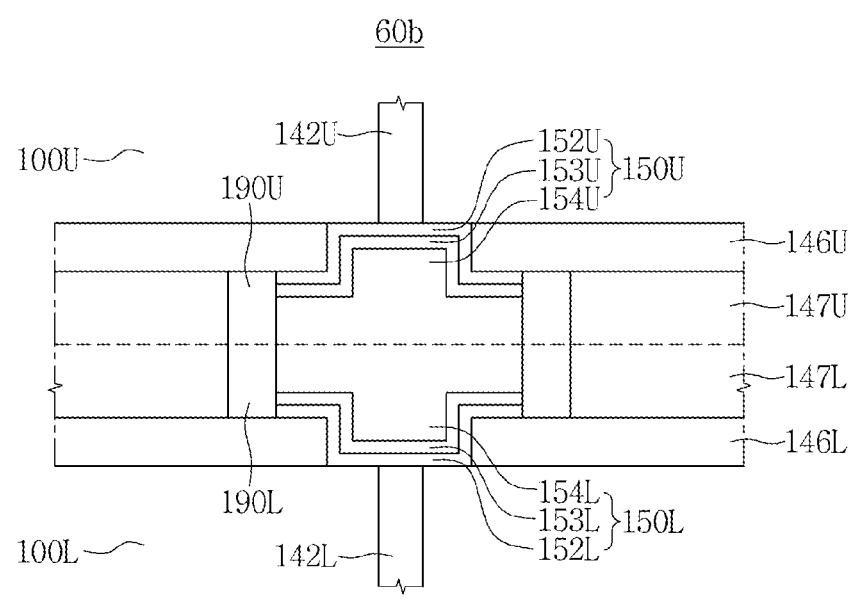

FIGS. 6A and 6B show bonding structures 60a and 60b of the pad structures 150 in accordance with embodiments of the inventive concept.

Referring to FIGS. 6A and 6B, in the bonding structures 60a and 60b of the pad structures 150 in accordance with the embodiments of the inventive concept, with reference further to FIGS. 2A to 2C, upper pad structures 150U of the upper semiconductor devices 10U and lower semiconductor devices 10L of the lower pad structures 150L may be respectively bonded together.

The reference numerals of FIGS. 6A and 6B are similar to or the same as those of FIGS. 2A to 2C (e.g., 150U is similar to 150), and such sameness or similarity can indicate a correlation of the elements, layers, components, and the like. Therefore, a detailed description of such elements, layers, components, and the like, is not repeated.

Figure 7A:
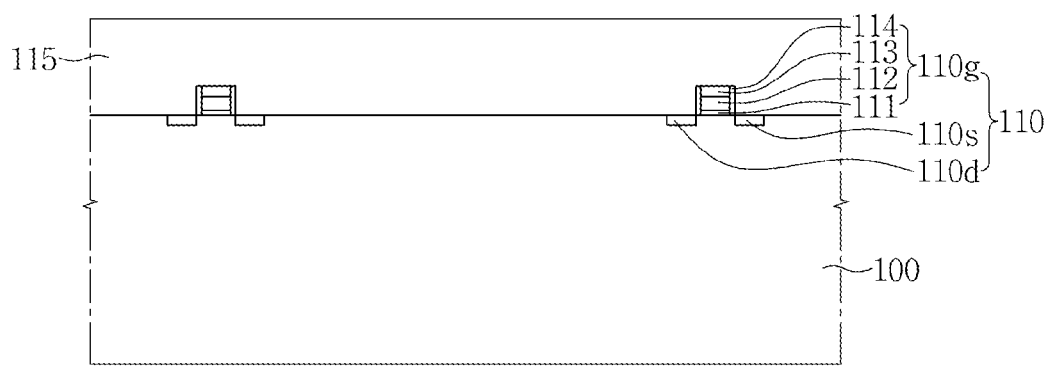
FIGS. 7A to 7T, FIGS. 8A to 8C, FIGS. 9A and 9B, FIGS. 10 to 13, FIGS. 14A and 14B, and FIG. 15 are vertical cross-sectional views showing methods of fabricating a semiconductor device in accordance with embodiments of the inventive concept.
Figure 7B:
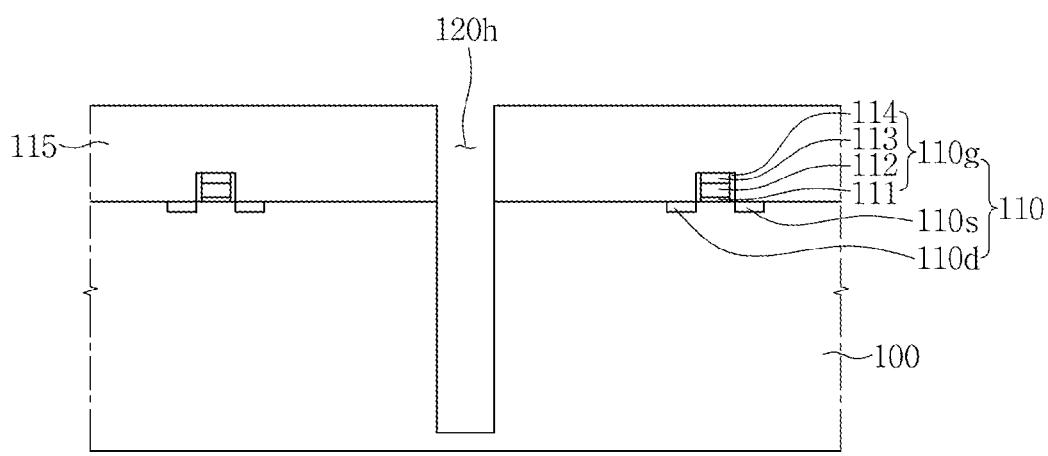
Figure 7C:
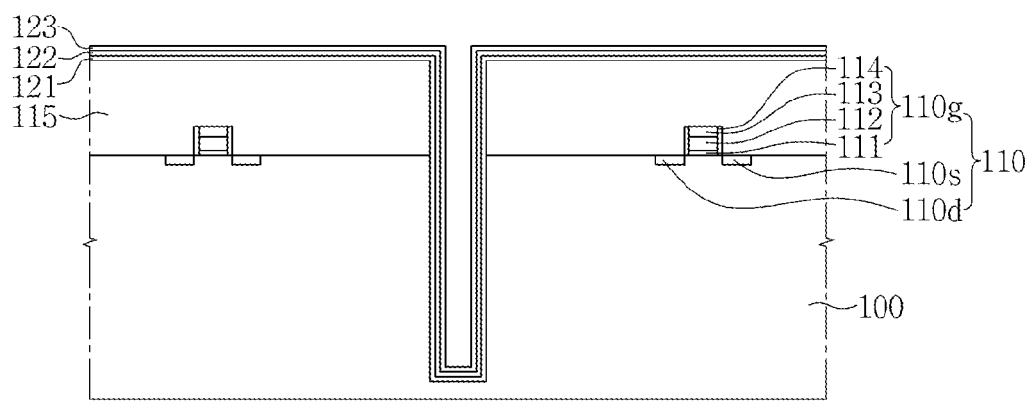
Figure 7D:
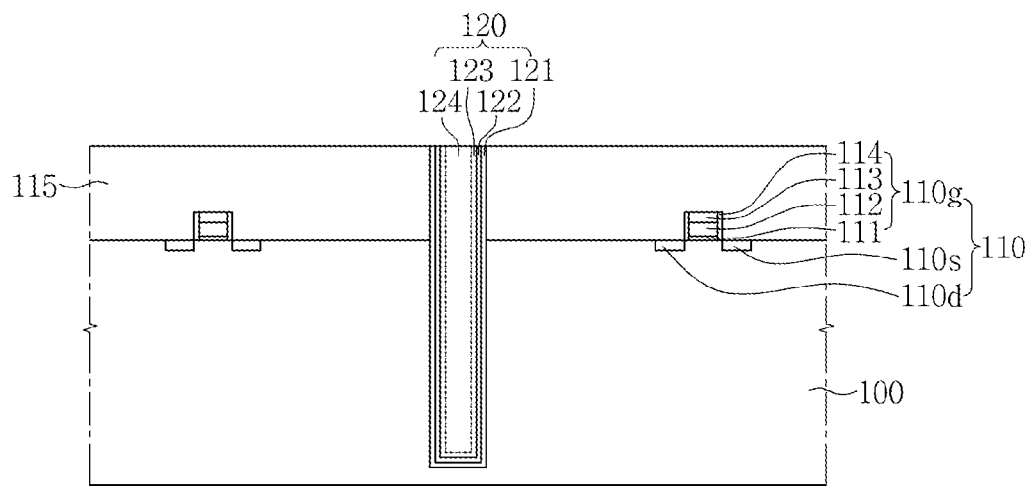
Figure 7E:
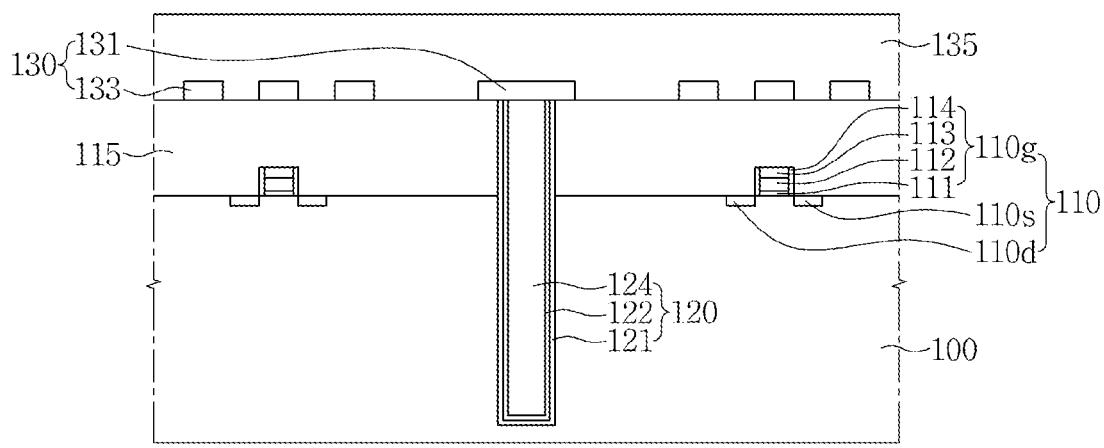
Figure 7F:
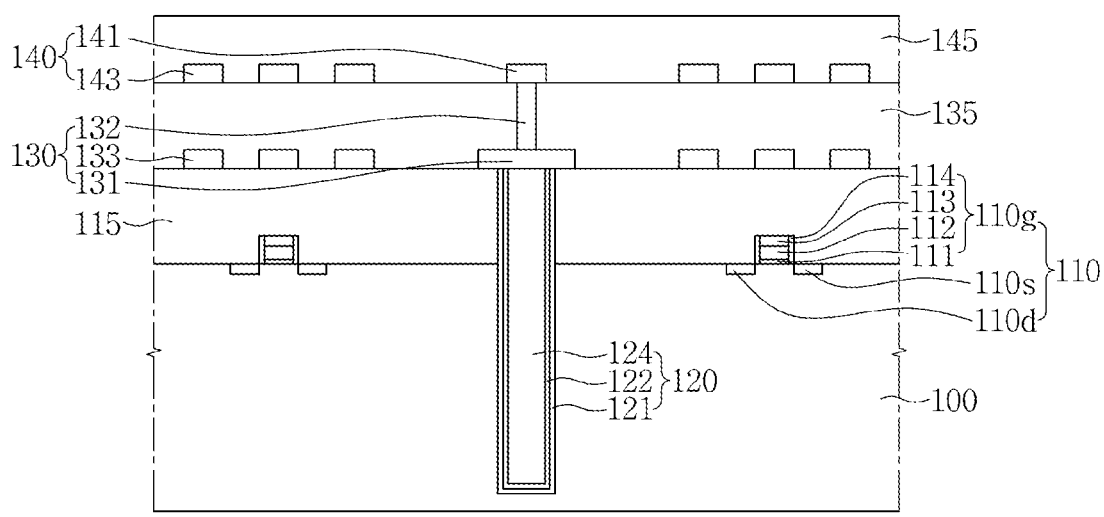
Figure 7G:
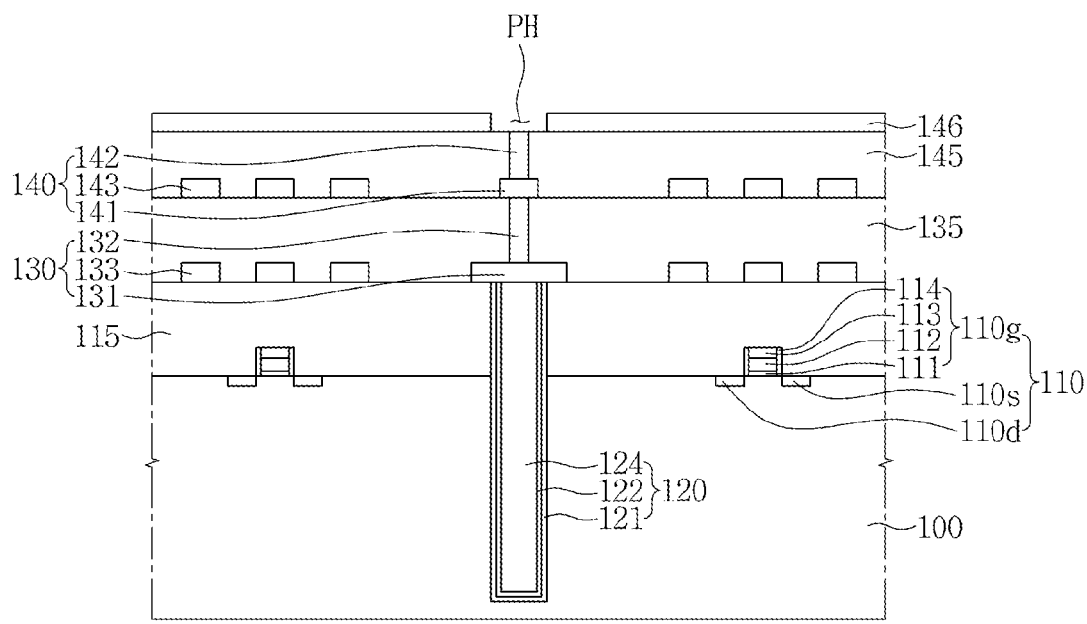
Figure 7H:
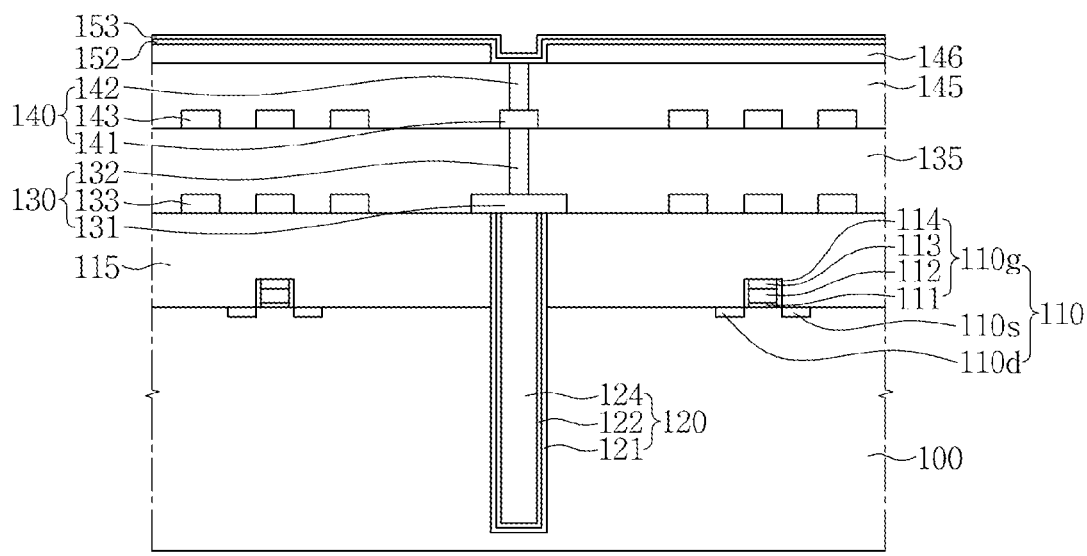
Figure 7I:
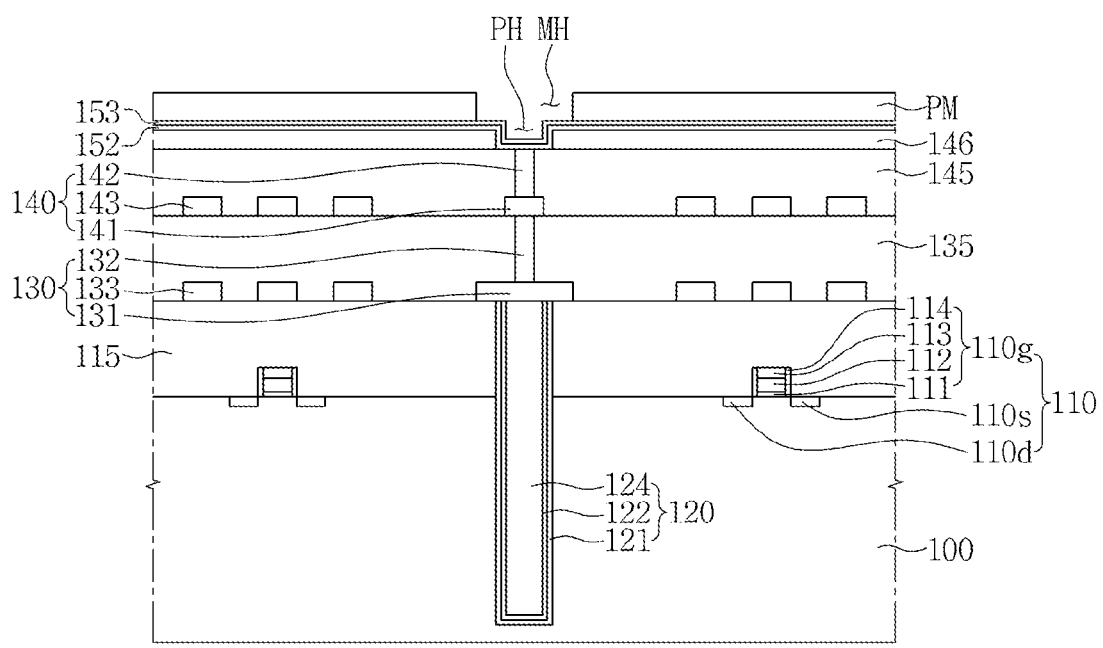
Figure 7J:
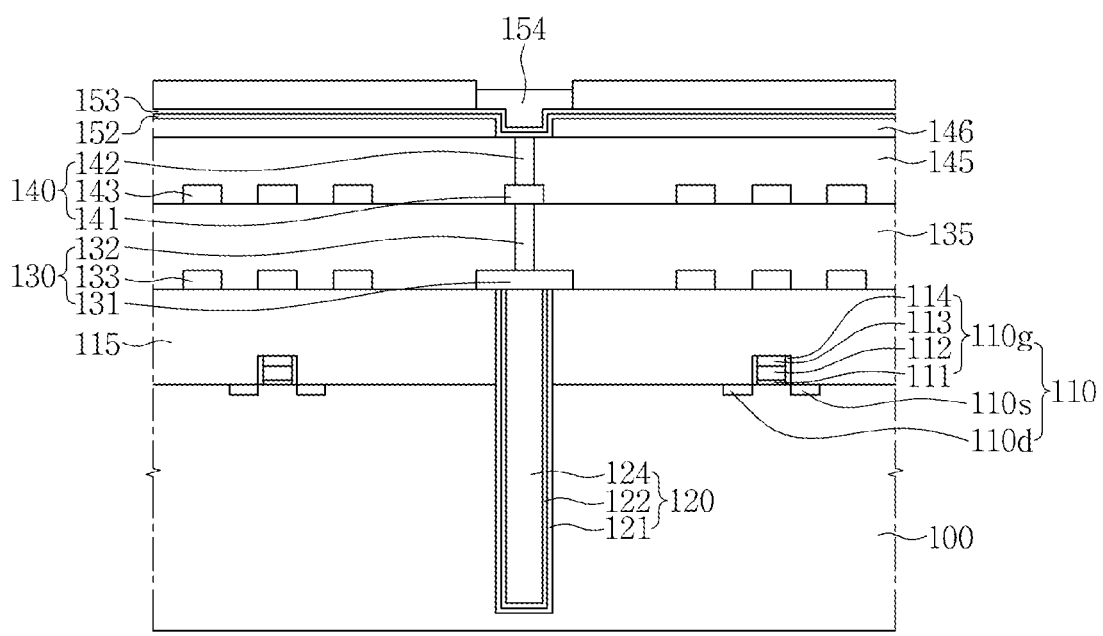
Figure 7K:
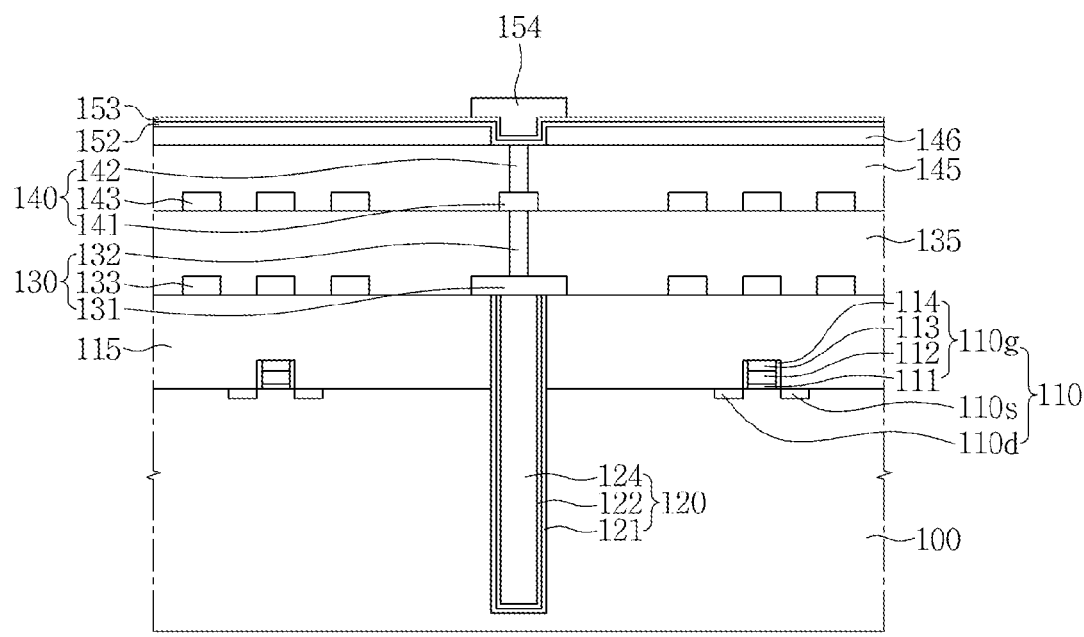
Figure 7L:
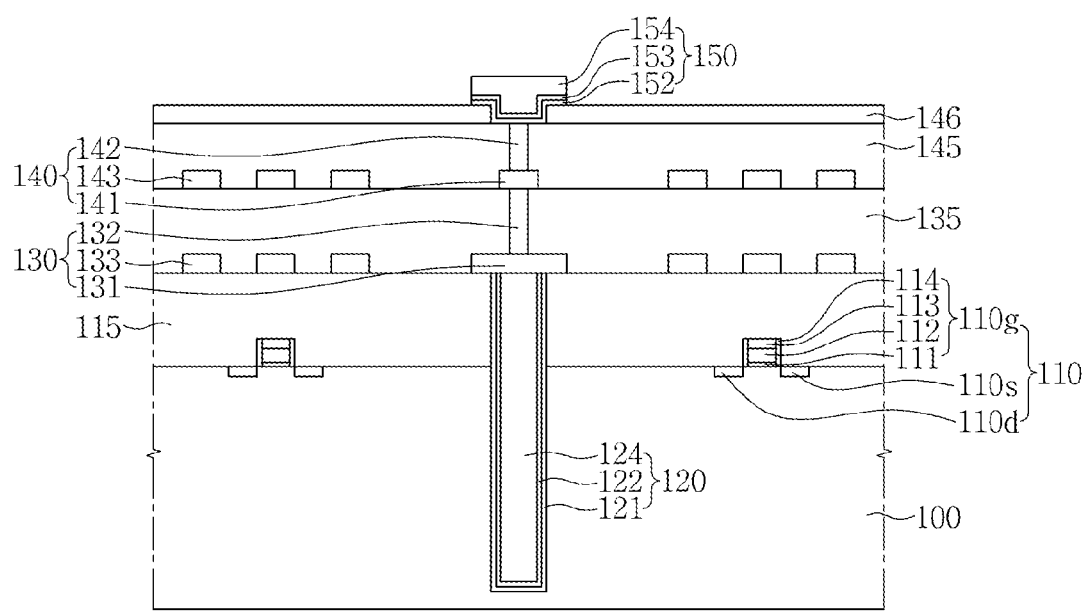
Figure 7M:
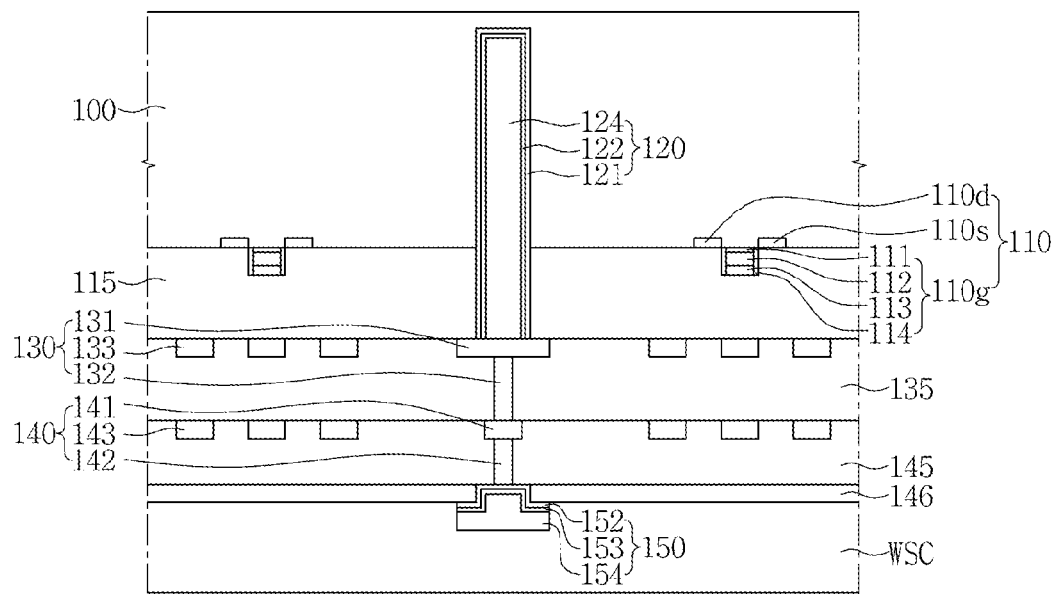
Figure 7N:
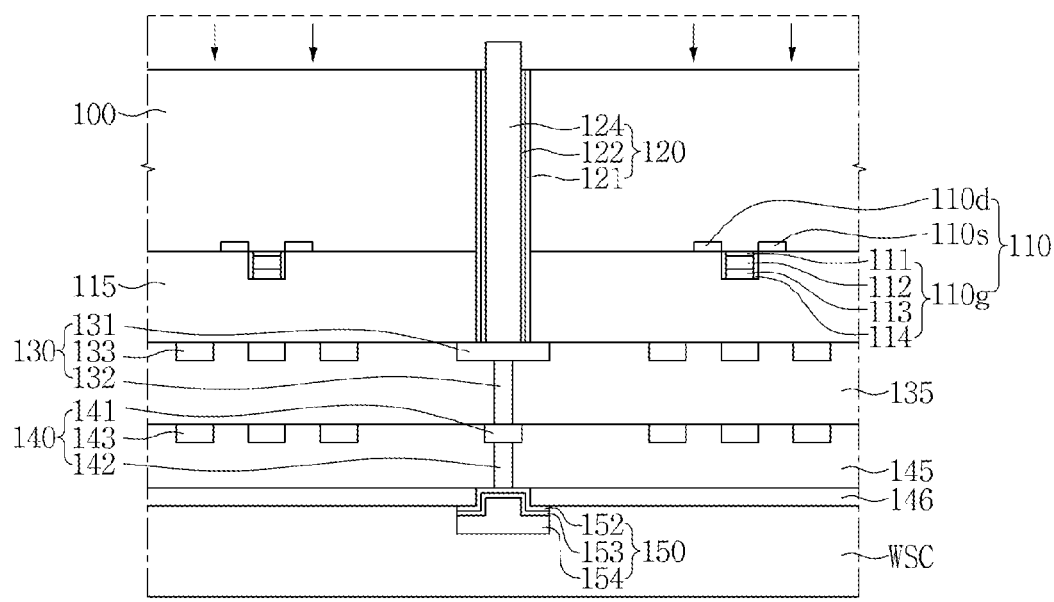
Figure 7O:
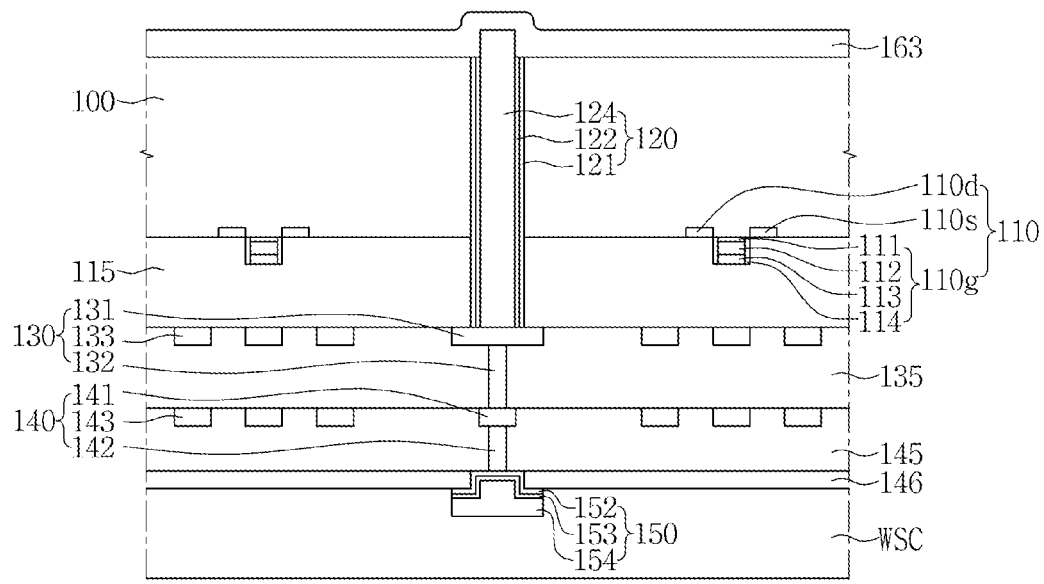
Figure 7P:
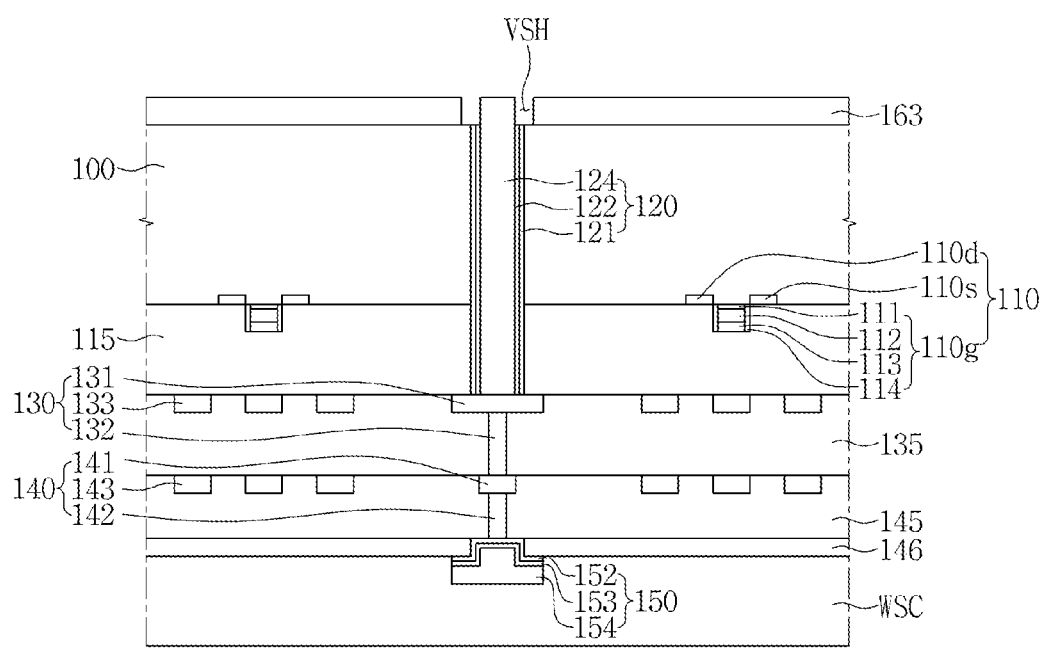
Figure 7Q:
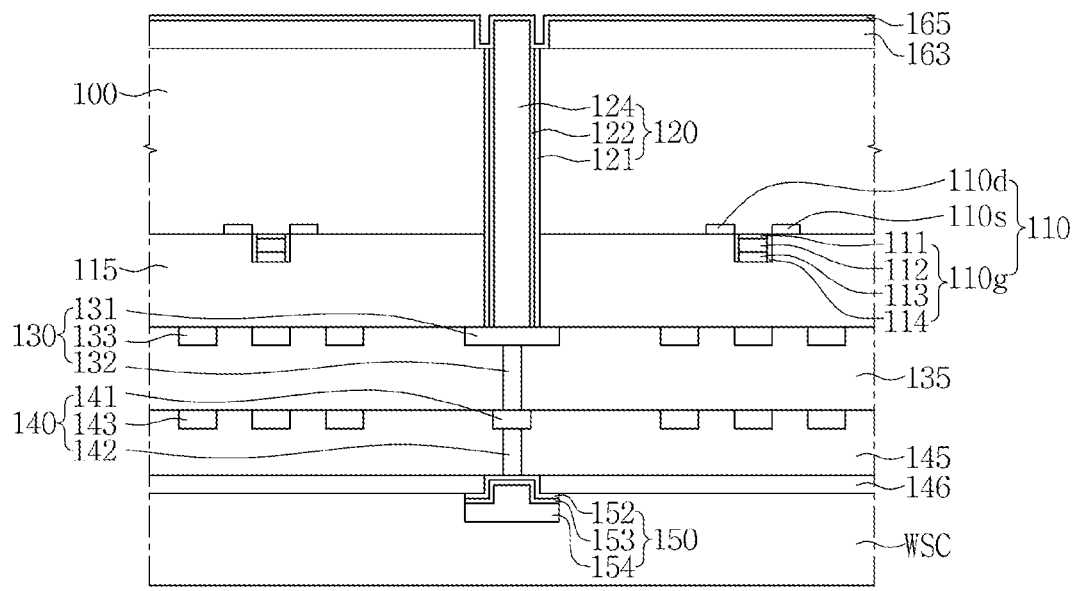
Figure 7R:
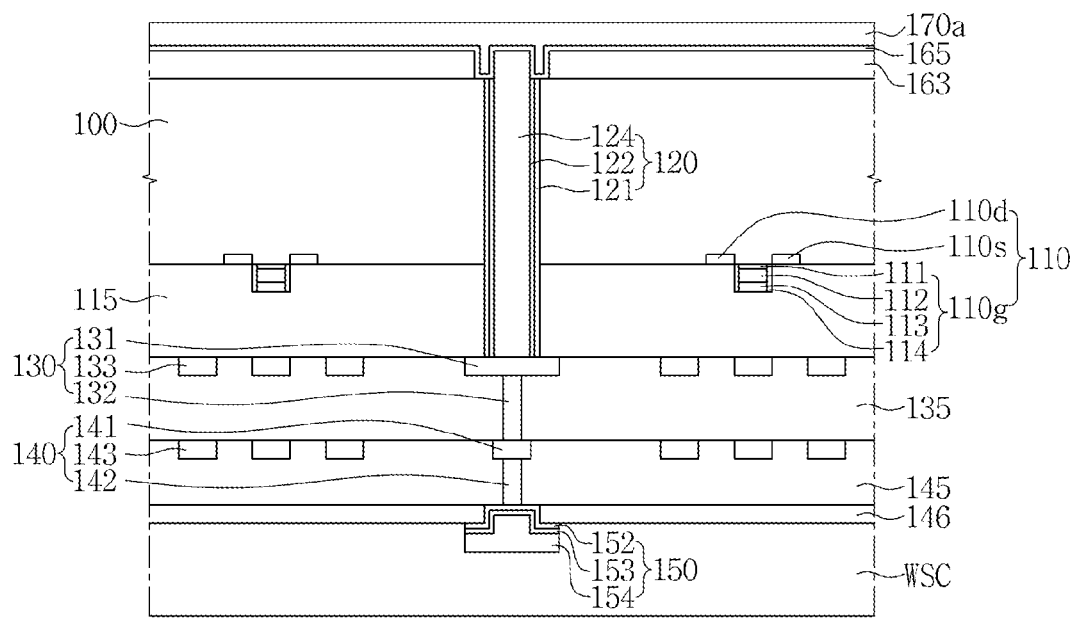
Figure 7S:
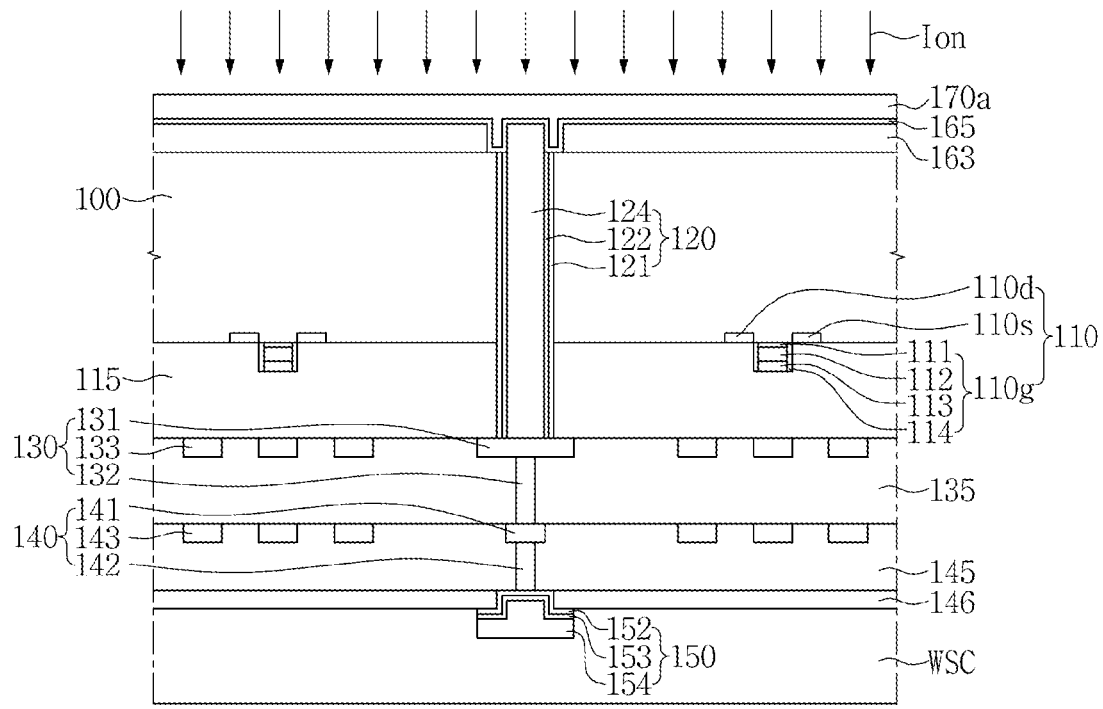
Figure 7T:
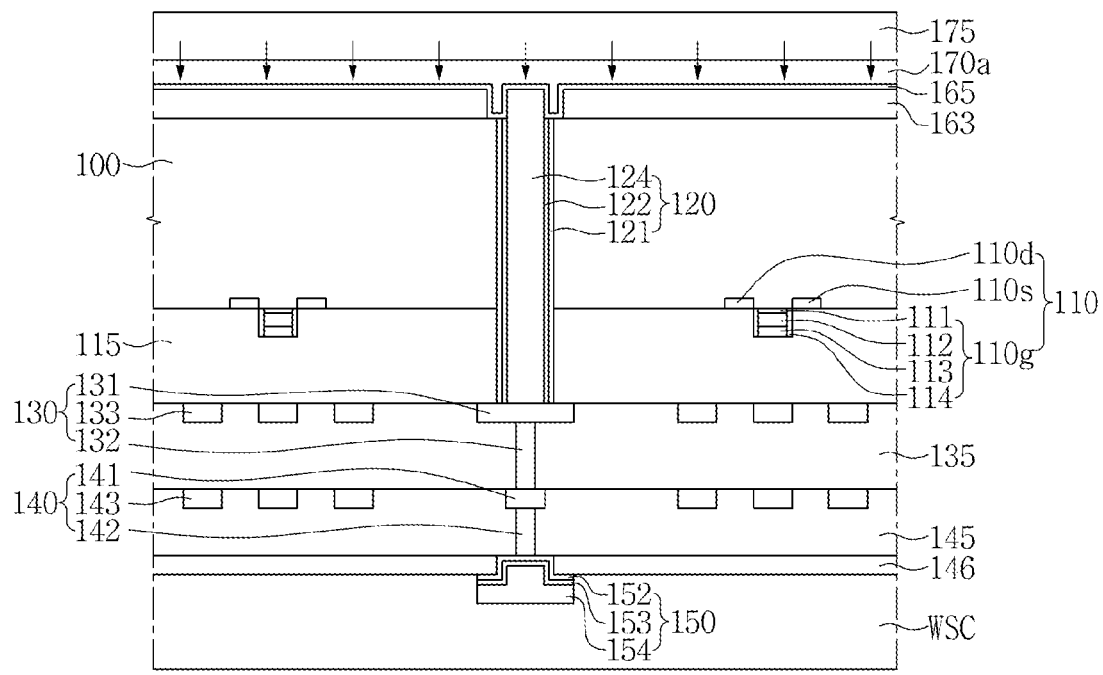

FIGS. 7A to 7T are vertical cross-sectional views showing a method of fabricating a semiconductor device in accordance with an embodiment of the inventive concept.

Referring to FIG. 7A, the method may include forming transistors 110 and a lower inter-layer insulating layer 115 on a substrate 100. The substrate 100 may include a single-crystalline silicon bulk wafer, a compound semiconductor wafer, or a silicon-on-insulator (SOI) wafer. The transistors 110 may include gate stacks 110g and/or source/drain areas 110s and 110d. The gate stack 110g may selectively include the gate insulating layer 111, the gate electrode 112, the gate capping layer 113, and/or the gate spacer 114. The gate insulating layer 111 may include silicon oxide or a metal oxide. The gate electrode 112 may include doped silicon, a silicide, a metal, or a metal compound. The gate capping layer 113 may include silicon nitride. The gate spacer 114 may include silicon oxide and/or silicon nitride. The source/drain areas 110s and 110d may include one of boron (B), phosphorus (P), and arsenic (As) injected into the substrate 100. The source/drain areas 110s and 110d may include a metal silicide. The lower inter-layer insulating layer 115 may include silicon oxide.

Referring to FIG. 7B, the method may include forming a TSV hole 120h. The TSV hole 120h may vertically pass through the lower inter-layer insulating layer 115, and extend into the substrate 100. A bottom of the TSV hole 120h may be located inside the substrate 100.

Referring to FIG. 7C, the method may include forming a TSV liner 121, a TSV barrier layer 122, and a TSV seed layer 123 in the TSV hole 120h. The TSV liner 121 may be formed using a sub-atmosphere chemical vapor deposition (SACVD) process or an atomic layered deposition (ALD) process. The TSV liner 121 may include silicon oxide and/or silicon nitride. The TSV bather layer 122 may be formed using a physical vapor deposition (PVD) process such as a sputtering process. The TSV barrier layer 122 may include titanium (Ti), titanium nitride (TiN), tantalum (Ta), tantalum nitride (TaN), a titanium tungsten alloy (TiW), or another bather metal, an alloy, and/or metal compound. The TSV seed layer 123 may be formed using a PVD process such as a sputtering process. The TSV seed layer 123 may include copper, nickel, or another seed metal.

Referring to FIG. 7D, the method may include forming a TSV core 124 and exposing the lower inter-layer insulating layer 115. The TSV core 124 may be formed using a plating process. The TSV core 124 may include copper. For example, when the TSV seed layer 123 and the TSV core 124 include the same metal, a boundary therebetween may disappear. Accordingly, the boundary between the TSV seed layer 123 and the TSV core 124 is indicated by a dotted line in FIG. 7D. The boundary between the TSV seed layer 123 and the TSV core 124 is omitted in drawings subsequent to FIG. 7D.

The TSV liner 121, the TSV bather layer 122, the TSV seed layer 123, and the TSV core 124, which are disposed on the lower inter-layer insulating layer 115 can be removed by performing a planarization process such as a chemical mechanical polishing (CMP) process. In this process, the TSV structure 120 including the TSV liner 121, TSV barrier layer 122, TSV seed layer 123, and TSV core 124 may be formed.

Referring to FIG. 7E, the method may include forming a lower metal interconnection 130 and an intermediate inter-layer insulating layer 135 on the lower inter-layer insulating layer 115. The lower metal interconnection 130 may include the TSV pad 131 and the lower metal lines 133. For example, the lower metal interconnection 130 may include tungsten, copper, aluminum, or another metal. The intermediate inter-layer insulating layer 135 may include silicon oxide.

Referring to FIG. 7F, the method may include forming a lower via plug 132 in the intermediate inter-layer insulating layer 135, and forming an upper metal interconnection 140 and an upper inter-layer insulating layer 145 on the intermediate inter-layer insulating layer 135. The lower via plug 132 may vertically penetrate the intermediate inter-layer insulating layer 135 to be connected to the TSV pad 131. The upper metal interconnection 140 may include an inter-via pad 131 and upper metal lines 143. The inter-via pad 141 may be aligned with and connected to the lower via plug 132. The lower via plug 132 and the upper metal interconnection 140 may include tungsten, copper, aluminum, or another metal. The upper inter-layer insulating layer 145 may include silicon oxide.

Referring to FIG. 7G, the method may include forming an upper via plug 142 in the upper inter-layer insulating layer 145, and forming a front-side passivation layer 146 on the upper inter-layer insulating layer 145. The upper via plug 142 may vertically pass through the upper inter-layer insulating layer 145 to be in contact with the inter-via pad 141. The upper via plug 142 may include tungsten, copper, aluminum, or another metal. The front-side passivation layer 146 may include a pad hole PH exposing the upper via plug 142. The front-side passivation layer 146 may include silicon oxide and/or silicon nitride.

Referring to FIG. 7H, the method may include forming a pad barrier layer 152 and a pad seed layer 153 in the pad hole PH and on the front-side passivation layer 146. The pad barrier layer 152 may be formed using a PVD process such as a sputtering process. The pad barrier layer 152 may include titanium (Ti), titanium nitride (TiN), tantalum (Ta), tantalum nitride (TaN), a titanium tungsten alloy (TiW), or another barrier metal, an alloy and/or a metal compound. The pad seed layer 153 may be formed using a PVD process such as a sputtering process. The TSV seed layer 123 may include copper, nickel, or another seed metal.

Referring to FIG. 7I, the method may include forming a pad mask PM on the pad seed layer 153. The pad mask PM may include a mask hole MH, which is aligned with the upper via plug 142 and/or the pad hole PH, and exposes the pad seed layer 153. The pad mask PM may include a photoresist or an organic polymeric material.

Referring to FIG. 7J, the method may include forming a pad core 154 in the mask hole MH. The pad core 154 may be formed by a plating method. The pad core 154 may include copper. When the pad seed layer 153 and the pad core 154 include the same metal, a boundary therebetween may disappear. In order to exemplarily show that the pad seed layer 153 and the pad core 154 can include a different metal, the boundary between the pad seed layer 153 and the pad core 154 is shown in FIG. 7J.

Referring to FIG. 7K, the method may include removing the pad mask PM to expose the pad seed layer 153 and the pad barrier layer 152. The pad mask PM may be removed by performing a sulfuric acid boiling process or an ashing process using oxygen plasma.

Referring to FIG. 7L, the method may include removing the exposed pad seed layer 153 and the pad barrier layer 152.

The pad seed layer 153 may be removed by performing a wet etching process using a chemical solution including a hydrogen peroxide solution, citric acid, and water. The pad barrier layer 152 may be removed by performing a wet etching process using a chemical solution including a hydrogen peroxide solution, KOH, and water. Through the above-described processes, the pad structure 150 including the pad barrier layer 152, pad seed layer 153, and pad core 154 may be formed.

Referring to FIG. 7M, the method may include overturning the substrate 100. The pad structure 150 may be supported and protected by a wafer support carrier (WSC).

Referring to FIG. 7N, the method may include recessing a back-side of the substrate 100 to expose an end portion of the TSV structure 120. For example, the end portion of the TSV core 124 may protrude from the back-side of the substrate 100.

Referring to FIG. 7O, the method may include forming a back-side passivation layer 163 on the back-side of the substrate 100. The back-side passivation layer 163 may include silicon oxide and/or silicon nitride formed in a CVD process. In other embodiments, an additional insulating layer may be interposed between the back-side of the substrate 100 and the back-side passivation layer 163.

Referring to FIG. 7P, the method may include forming a disk-shaped via-surrounding hole VSH by removing the back-side passivation layer 163 around the TSV core 124. Surfaces of the substrate 100, the TSV liner 121, and/or the TSV barrier layer 122 may be exposed on a bottom of the via-surrounding hole VSH.

Referring to FIG. 7Q, the method may include forming a back-side lining layer 165 on inner walls and bottom surface of the via-surrounding hole VSH, and a top surface of the back-side passivation layer 163, using a CVD or ALD process. In some embodiments, the back-side lining layer 165 may be conformally formed on inner walls and bottom surface of the via-surrounding hole VSH. The back-side lining layer 165 may include a low-k insulating material, such as BLACKDIAMOND (a trade name, manufactured by Applied Materials, Inc.), SiCHO, porous $SiO_2$, and SILK (a trade name, Dow Chemical). In other embodiments, the back-side lining layer 165 may include silicon nitride.

Referring to FIG. 7R, the method may include forming a back-side piezoelectric material layer 170a to fill the via-surrounding hole VSH. The back-side piezoelectric material layer 170a may be formed in a variety of processes, such as a deposition process, a spin coating process, a dispensing process, and a pasting process, depending on a material. For example, the back-side piezoelectric material layer 170a may include one of a synthetic crystal materials including quartz analogic crystal, such as gallium orthophosphate ($GaPO_4$) or Langasite ($La_3Ga_5SiO_{14}$), a synthetic ceramic, such as barium titanate ($BaTiO_3$), potassium niobate ($KNbO_3$), lithium niobate ($LiNbO_3$), lithium tantalite ($LiTaO_3$), sodium tungstate ($Na_2WO_3$), zinc oxide (ZnO), or barium sodium niobate ($Ba_2NaNb_5O_5$), a lead-free ceramic, such as sodium potassium niobate ($(K,Na)NbO_3$), bismuth ferrite ($BiFeO_3$), sodium niobate ($NaNbO_3$), bismuth titanate ($Bi_4Ti_3O_{12}$), or sodium bismuth titanate ($Na_{0.5}Bi_{0.5}TiO_3$), a polymeric material such as polyvinylidene fluoride (—$(C_2H_2F_2)N$—) (PVDF), or an organic nanostructure such as self-assembled diphenylalanine peptide nanotubes (PNTs).

Referring to FIG. 7S, the method may include performing an ion-implantation process to inject ions into the back-side piezoelectric material layer 170a. The ions may include one or more among boron (B), phosphorus (P), and arsenic (As).

For example, boron, phosphorus, or arsenic in an ionic state may be injected into the back-side piezoelectric material layer 170a using an electric field. In other embodiments, the method may include injecting ions into the back-side piezoelectric material layer 170a by performing a diffusion process using a gas source, without using the ion-implantation process. For example, the method may include loading a wafer having the back-side piezoelectric material layer 170a in a vacuum chamber, supplying one of di-borane ($B_2H_6$), boron tribromide ($BBr_3i$), phosphine ($PH_3$), phosphorous oxychloride ($POCl_3$), and arsenic trihydrogen ($AsH_3$) into the vacuum chamber, and diffusing the boron, phosphorus, or arsenic in the back-side piezoelectric material layer 170a by heating.

In still other embodiments, referring to FIG. 7T, the method may include forming a diffusion source layer 175 containing boron, phosphorus, and/or arsenic, on the back-side piezoelectric material layer 170a. The method may further include diffusing the boron, phosphorus, and/or arsenic in the diffusion source layer 175 into the back-side piezoelectric material layer 170a by performing a diffusion process. The diffusion source layer 175 may include boron silicate glass (BSG), phosphorous silicate glass (PSG), boron phosphorous silicate glass (BPSG), BN, $P_2O_5$, or $Al_2O_3$ in a solid state, or $AsCl_3$ in a liquid state.

Next, referring to FIG. 1A, the method may include removing the back-side piezoelectric material layer 170a on the back-side passivation layer 163 by performing a planarization process such as an etchback or CMP process, to form the back-side piezoelectric pattern 170 surrounding the TSV core 124. In other embodiments, referring further to FIG. 7T, the method may include removing the diffusion source layer 175 on the back-side piezoelectric material layer 170a by performing a planarization process.

Figure 8A:
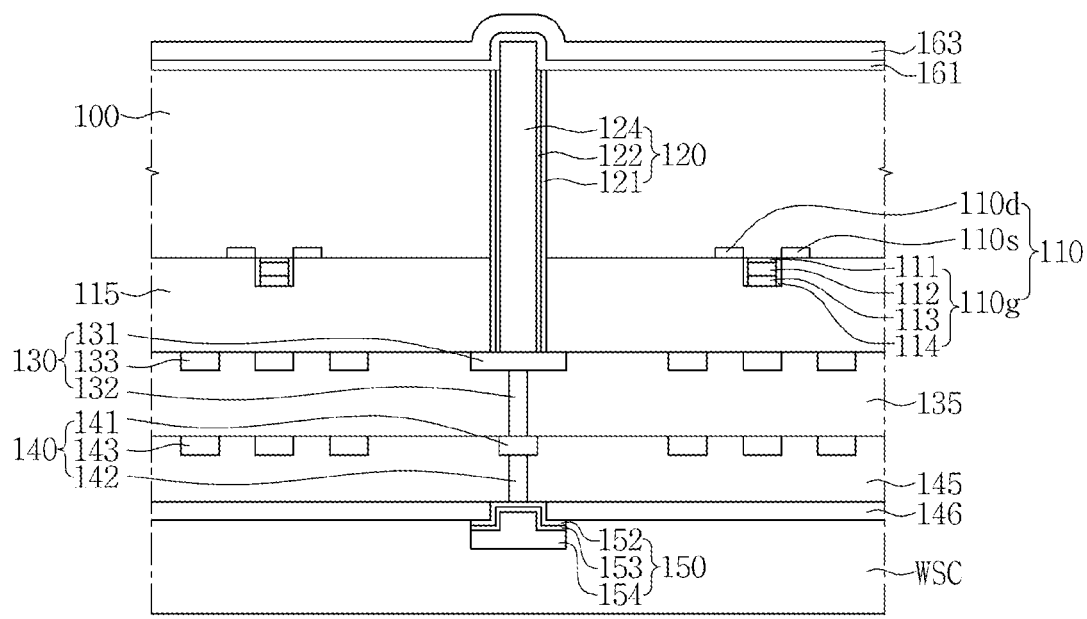
Figure 8B:
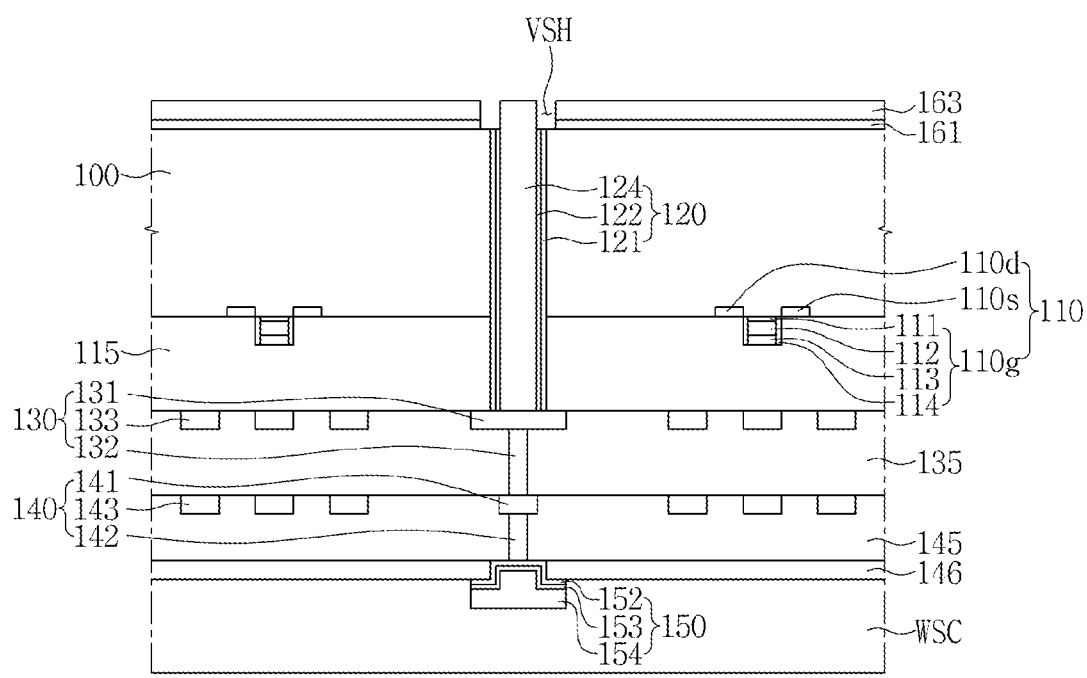
Figure 8C:
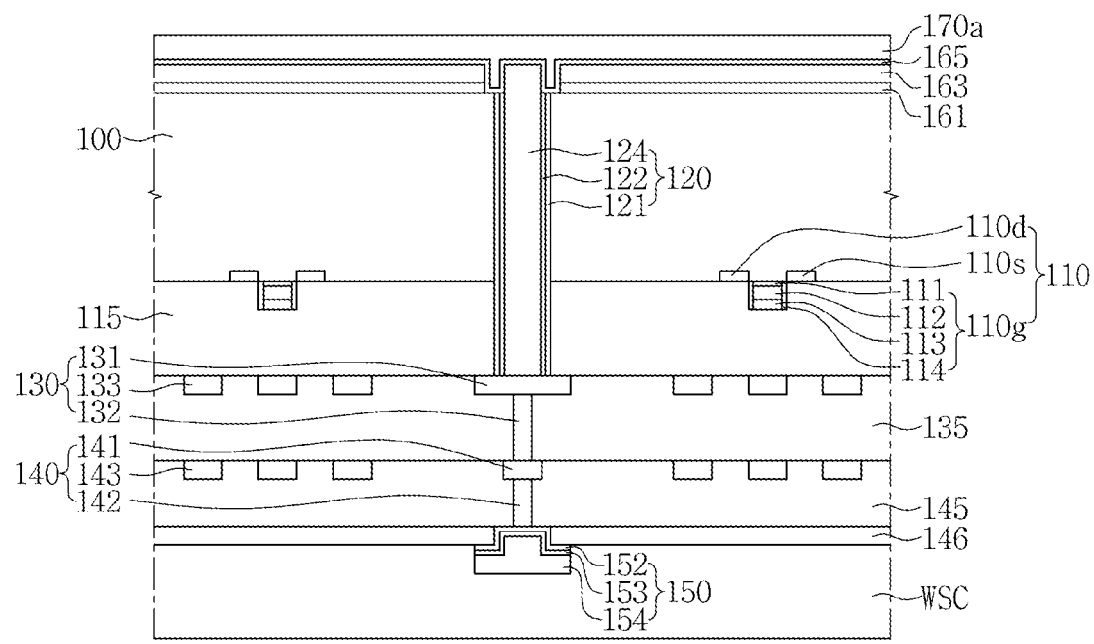

FIGS. 8A to 8C are vertical cross-sectional views showing a method of fabricating a semiconductor device in accordance with an embodiment of the inventive concept. Referring to FIG. 8A, the method may include exposing the TSV structure 120 by performing the processes described with reference to FIGS. 7A to 7N, and forming the back-side buffer insulator 161 and the back-side passivation layer 163 on the back-side of the substrate 100. The back-side buffer insulator 161 may include silicon oxide, and the back-side passivation layer 163 may include silicon oxide and/or silicon nitride.

Referring to FIG. 8B, the method may include forming a disk-shaped via-surrounding hole VSH by removing the back-side passivation layer 163 and the back-side buffer insulator 161 around the TSV core 124. Surfaces of the substrate 100, the TSV liner 121, and/or the TSV bather layer 122 may be exposed on a bottom of the via-surrounding hole VSH. The back-side buffer insulator 161 may be exposed on an inner wall of the via-surrounding hole VSH.

Referring to FIG. 8C, the method may include forming the back-side lining layer 165 on the inner wall and bottom of the via-surrounding hole VSH, and a top surface of the back-side passivation layer 163, by performing the processes described with reference to FIGS. 7Q to 7R, and forming the back-side piezoelectric material layer 170a to fill the via-surrounding hole VSH. Next, the method may further include injecting ions into the back-side piezoelectric material layer 170a by performing the processes described with reference to FIG. 7S or 7T. Next, referring to FIG. 1B, the method may include removing the back-side piezoelectric material layer 170a on the back-side passivation layer 163 by performing a planarization process such as an etchback or CMP process to form the back-side piezoelectric pattern 170 surrounding the TSV core 124. The method may include, referring further to FIG. 7T, removing the diffusion source layer 175 on the back-side piezoelectric material layer 170a.

Figure 9A:
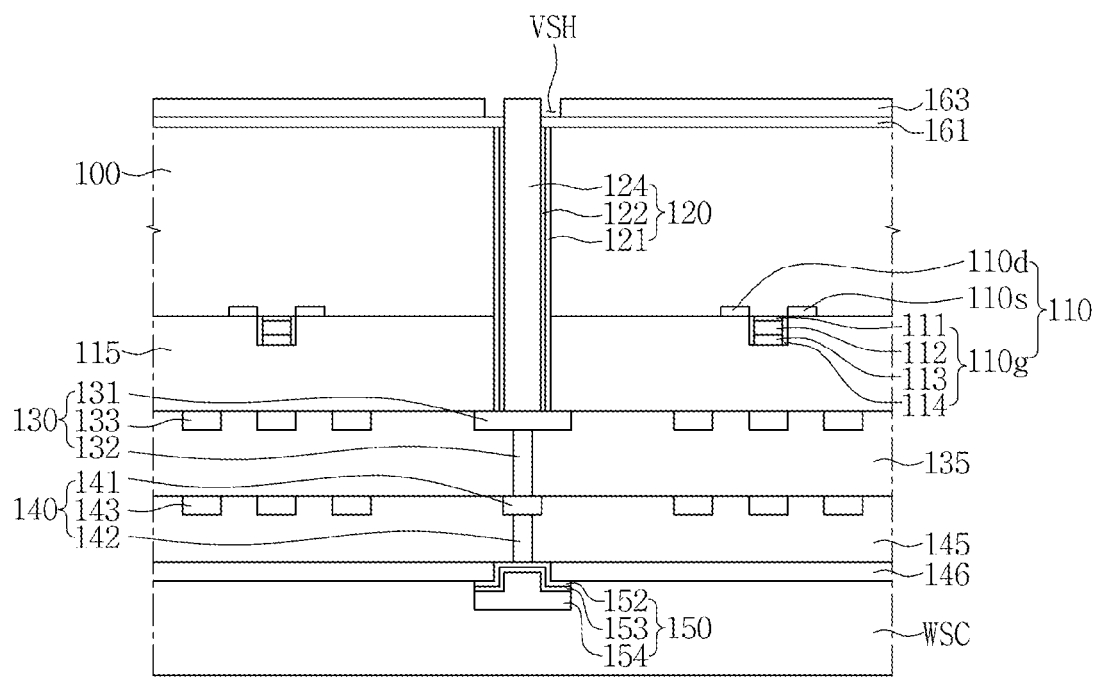
Figure 9B:
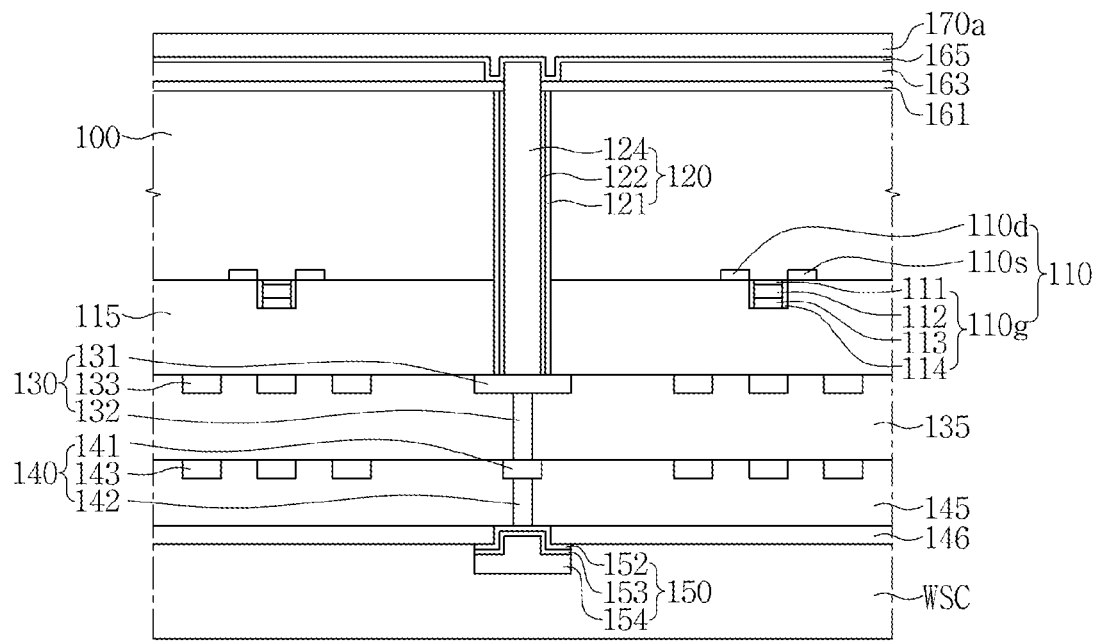

FIGS. 9A and 9B are vertical cross-sectional views showing a method of fabricating a semiconductor device in accordance with an embodiment of the inventive concept. Referring to FIG. 9A, the method may include performing the processes described with reference to FIGS. 7A to 7N and 8A, and forming a disk-shaped via-surrounding hole VSH by removing the back-side passivation layer 163 and the back-side buffer insulator 161 around the TSV core 124. The back-side buffer insulator 161 may be exposed on a bottom of the via-surrounding hole VSH.

Referring to FIG. 9B, the method may include forming a back-side lining layer 165 on inner walls and bottom of the via-surrounding hole VSH, and a top surface of the back-side passivation layer 163 by performing the processes described with reference to FIGS. 7Q to 7R, and forming a back-side piezoelectric material layer 170a to fill the via-surrounding hole VSH. Next, the method may include injecting ions into the back-side piezoelectric material layer 170a by performing the processes described with reference to FIG. 7S or 7T. Next, referring to FIG. 1C, the method may include removing the back-side piezoelectric material layer 170a on the back-side passivation layer 163 by performing a planarization process such as an etchback or CMP process, to form a back-side piezoelectric pattern 170 surrounding the TSV core 124. Referring further to FIG. 7T, the method may include removing the diffusion source layer 175 on the back-side piezoelectric material layer 170a.

Figure 10:
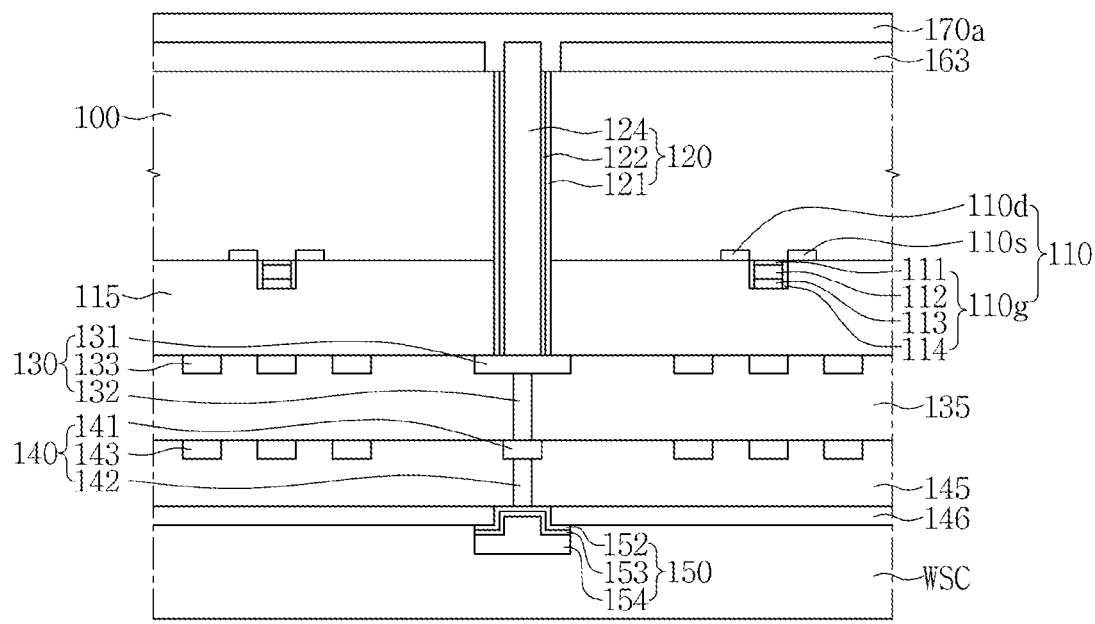

FIG. 10 is a vertical cross-sectional view showing a method of fabricating a semiconductor device in accordance with an embodiment of the inventive concept. Referring to FIG. 10, the method may include performing the processes described with reference to FIGS. 7A to 7P, and forming a back-side piezoelectric material layer 170a on the via-surrounding hole VSH and the back-side passivation layer 163. For example, the back-side buffer insulator 161 shown in FIG. 7Q may be omitted. Next, the method may further include injecting ions into the back-side piezoelectric material layer 170a by performing the processes described with reference to FIG. 7S or 7T, and removing the back-side piezoelectric material layer 170a on the back-side passivation layer 163 by performing a planarization process described with reference to FIG. 1D, to form a back-side piezoelectric pattern 170 surrounding the TSV core 124.

Figure 11:
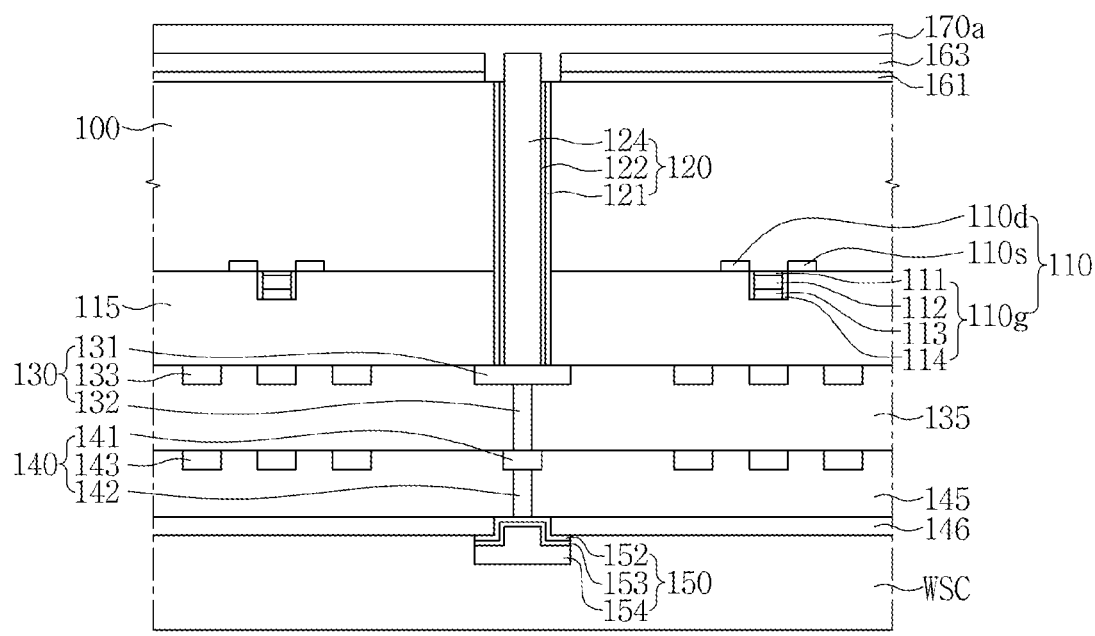

FIG. 11 is a vertical cross-sectional view showing a method of fabricating a semiconductor device in accordance with an embodiment of the inventive concept. Referring to FIG. 11, the method may include forming a via-surrounding hole VSH by performing the processes described with reference to FIGS. 7A to 7N, 8A, and 8C, and then forming a back-side piezoelectric material layer 170a to fill the via-surrounding hole VSH. Next, the method may include injecting ions into the back-side piezoelectric material layer 170a by performing the processes described with reference to FIG. 7S or 7T, and removing the back-side piezoelectric material layer 170a on the back-side passivation layer 163 by performing a planarization process described with reference to FIG. 1E, to form a back-side piezoelectric pattern 170 surrounding the TSV core 124.

Figure 12:
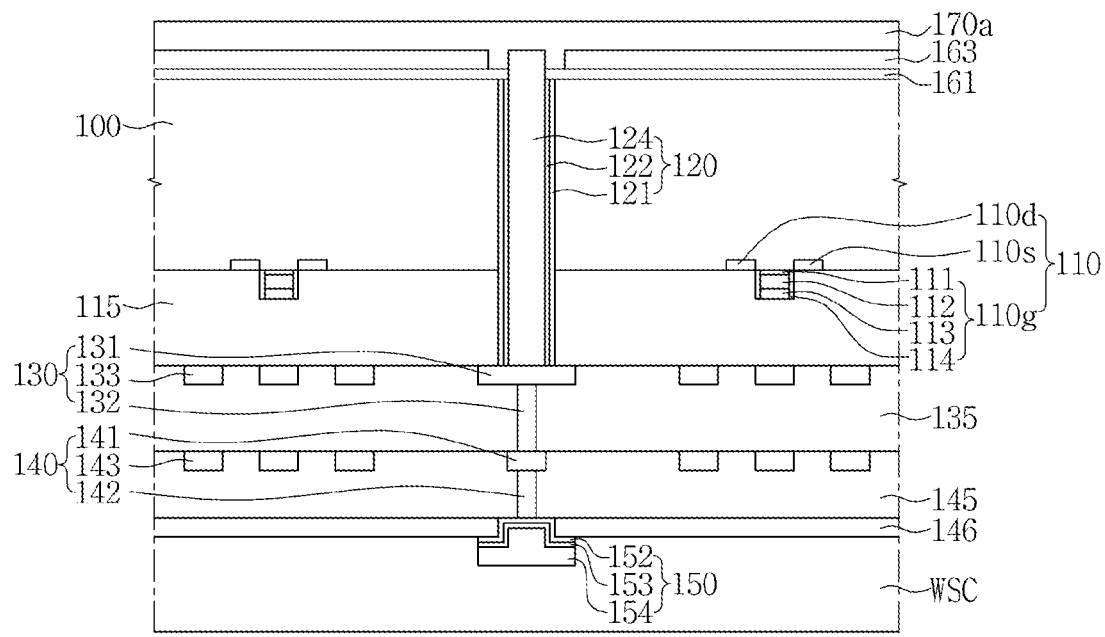

FIG. 12 is a vertical cross-sectional view showing a method of fabricating a semiconductor device in accordance with an embodiment of the inventive concept. Referring to FIG. 12, the method may include forming a via-surrounding hole VSH by performing the processes described with reference to FIGS. 7A to 7N, 9A, and 9B, and then forming a back-side piezoelectric material layer 170a to fill the via-surrounding hole VSH. Next, the method may include injecting ions into the back-side piezoelectric material layer 170a by performing the processes described with reference to FIG. 7S or 7T, and removing the back-side piezoelectric material layer 170a on the back-side passivation layer 163 by performing a planarization process described with reference further to FIG. 1F, to form a back-side piezoelectric pattern 170 surrounding the TSV core 124.

Figure 13:
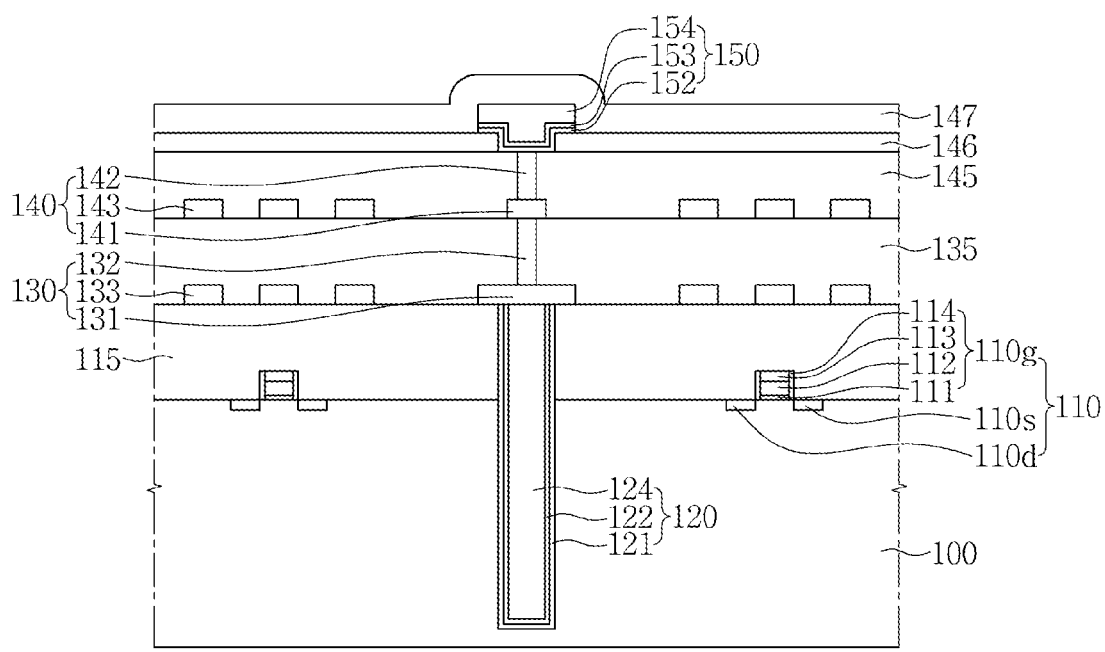

FIG. 13 is a vertical cross-sectional view showing a method of fabricating a semiconductor device in accordance with an embodiment of the inventive concept. Referring to FIG. 13, the method may include forming a pad structure 150 by performing the processes described with reference to FIGS. 7A to 7L, and then forming a wrapping layer 147. The wrapping layer 147 may include an insulating material, such as silicon oxide, silicon nitride, and polyimide. Next, referring further to FIG. 2A, the method may include performing a planarization process such as a CMP process to expose a surface of the pad structure 150, and performing the processes described with reference to FIGS. 7M to 7T.

Figure 14A:
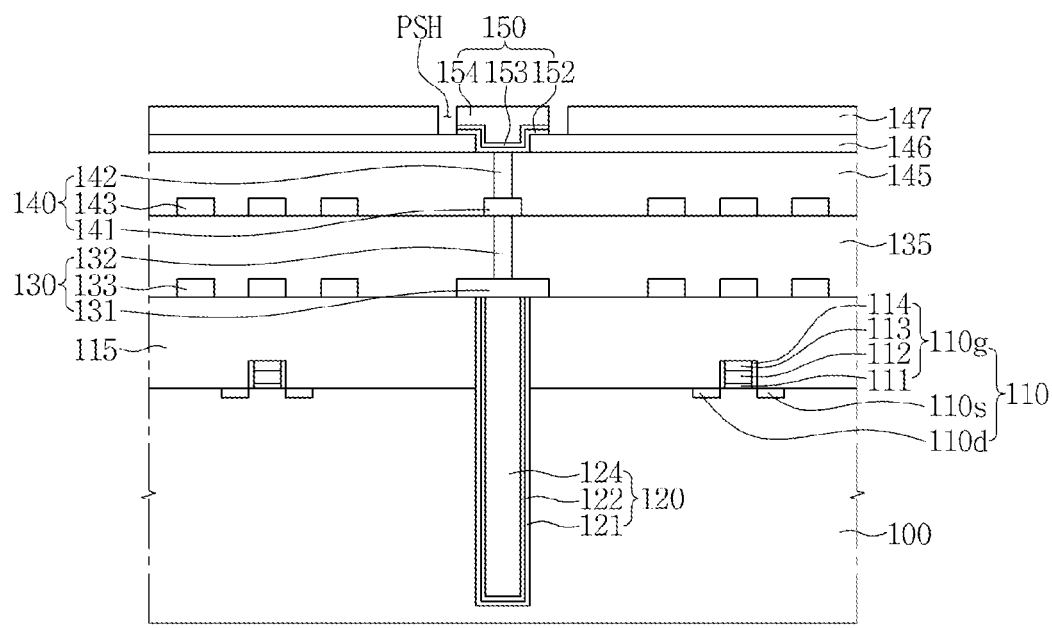
Figure 14B:
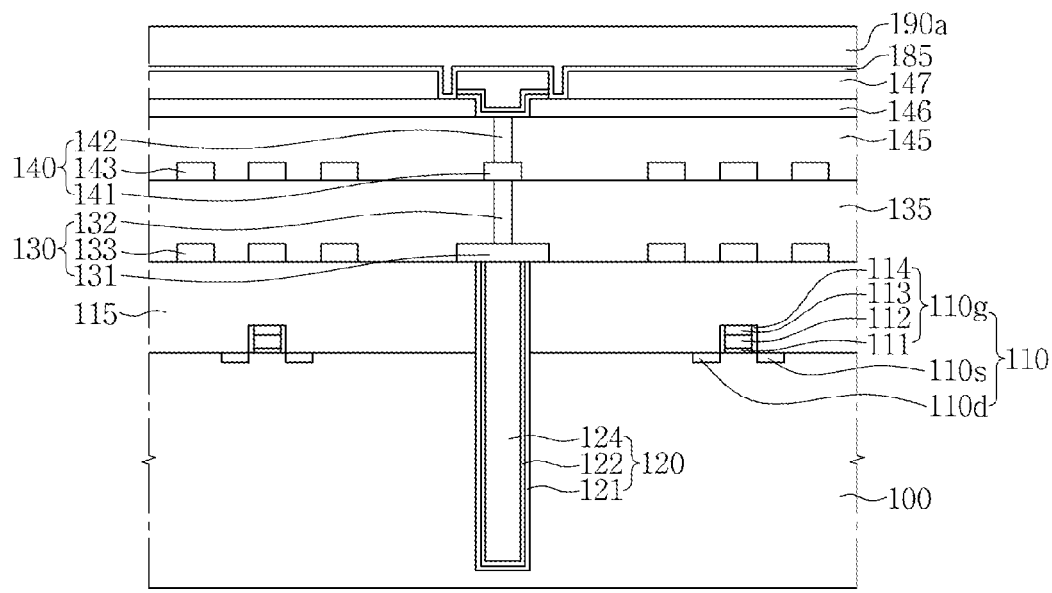

FIGS. 14A and 14B are vertical cross-sectional views showing a method of fabricating a semiconductor device in accordance with an embodiment of the inventive concept. Referring to FIG. 14A, the method may include forming a pad structure 150 by performing the processes described with reference to FIGS. 7A to 7L, forming a wrapping layer 147 by performing the processes described with reference to FIG. 13, exposing a surface of the pad structure 150, and forming a pad-surrounding hole PSH exposing the pad structure 150.

Referring to FIG. 14B, the method may include forming a front-side lining layer 185 in the pad-surrounding hole PSH, and forming a front-side piezoelectric material layer 190a to fill the pad-surrounding hole PSH. In some embodiments, the front-side lining layer 185 may be conformally formed in the pad-surrounding hole PSH. The front-side piezoelectric material layer 190a may include the same material as the above-described back-side piezoelectric material layer 170a. Next, referring further to FIG. 2B, the method may include performing a planarization process such as a CMP process to expose a surface of the pad structure 150, and performing the processes described with reference to FIGS. 7M to 7T.

Figure 15:
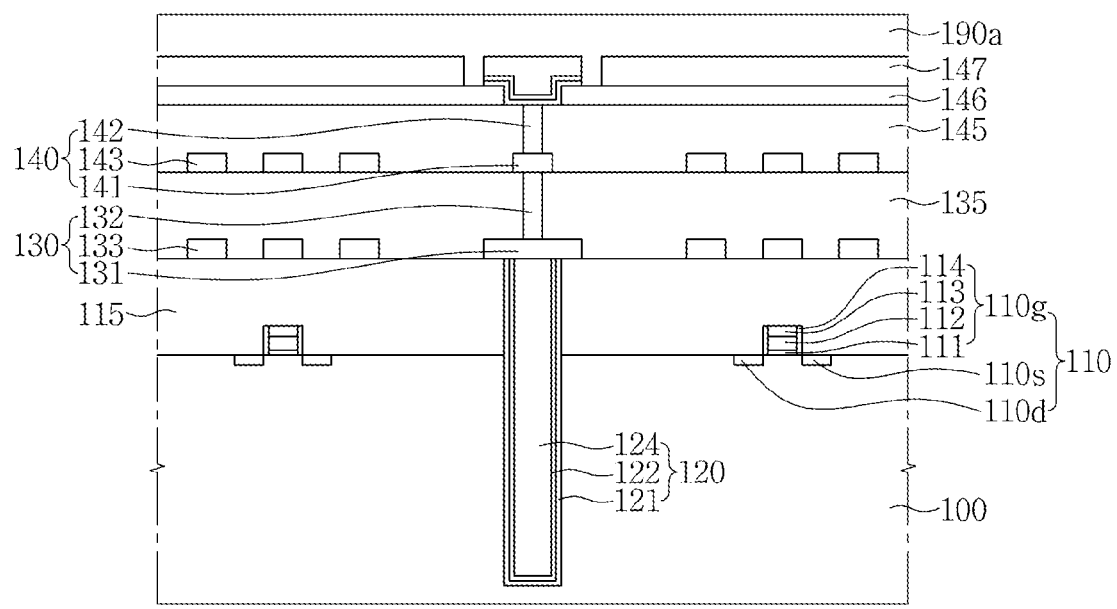

FIG. 15 is a vertical cross-sectional view showing a method of fabricating a semiconductor device in accordance with an embodiment of the inventive concept. Referring to FIG. 15, the method may include forming a pad structure 150 by performing the processes described with reference to FIGS. 7A to 7L, forming a wrapping layer 147 by performing the processes described with reference to FIG. 13, exposing the pad structure 150, forming a pad-surrounding hole PSH exposing the pad structure 150 by performing the process described with reference to FIG. 14A, and forming a front-side piezoelectric material layer 190a to fill the pad-surrounding hole PSH. Next, the method may include performing a planarization process such as a CMP process described with reference further to FIG. 2C to expose a surface of the pad structure 150, and performing the processes described with reference to FIGS. 7M to 7T.

FIGS. 16A to 16F are schematic views illustrating various bonding structures 70a to 70f of metal lines 220U and 220L in accordance with various embodiments of the inventive concept.

Referring to FIGS. 16A to 16F, the bonding structure 70a to 70f in accordance with various embodiments of the inventive concept may include an upper semiconductor device 12U and a lower semiconductor device 12L, which can be bonded together. For example, an upper device metal pattern 220U of the upper semiconductor device 12U and a lower device metal pattern 220L of the lower semiconductor device 12L may be directed bonded together.

The upper semiconductor device 12U may include an upper device passivation layer 263U, an upper device metal pattern 220U, and an upper device piezoelectric pattern 270U, which are disposed on an upper device substrate 200U. The lower semiconductor device 12L may include a lower device passivation layer 263L, a lower device metal pattern 220L, and a lower device piezoelectric pattern 270L, which are disposed on a lower device substrate 200L. The upper device passivation layer 263U may define the upper device metal pattern 220U, and the lower device passivation layer 263L may define the lower device metal pattern 220L. For example, the upper device passivation layer 263U may surround side surfaces of the upper device metal pattern 220U, and the lower device passivation layer 263L may surround side surfaces of the lower device metal pattern 220L.

The upper device piezoelectric pattern 270U surrounding the side surfaces of the upper device metal pattern 220U may be formed between the upper device passivation layer 263U and the upper device metal pattern 220U. The lower device piezoelectric pattern 270L surrounding the side surfaces of the lower device metal pattern 220L may be formed between the lower device passivation layer 263L and the lower device metal pattern 220L.

Figure 16A:
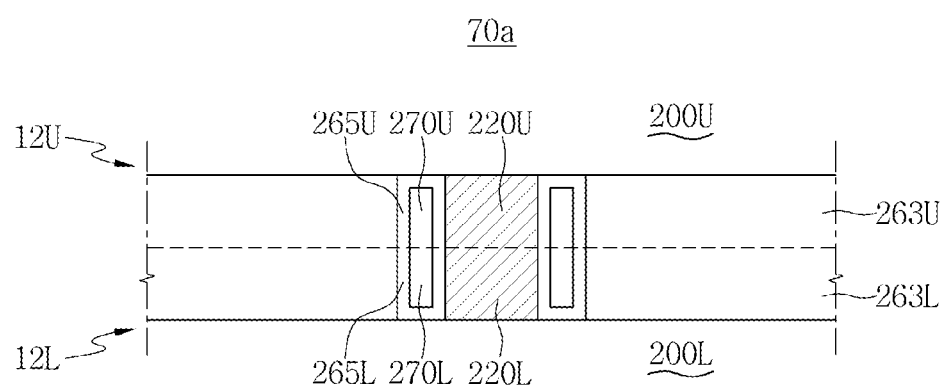
FIGS. 16A to 16F are schematic views illustrating bonding structures of metal interconnections in accordance with embodiments of the inventive concept.
Figure 16B:
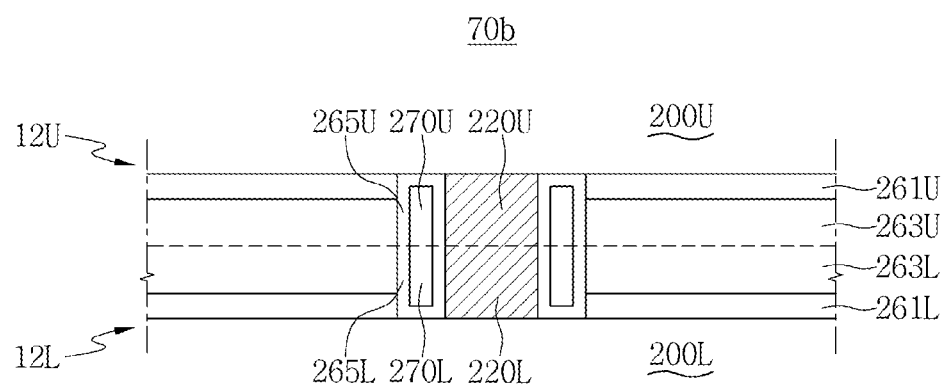
Figure 16C:
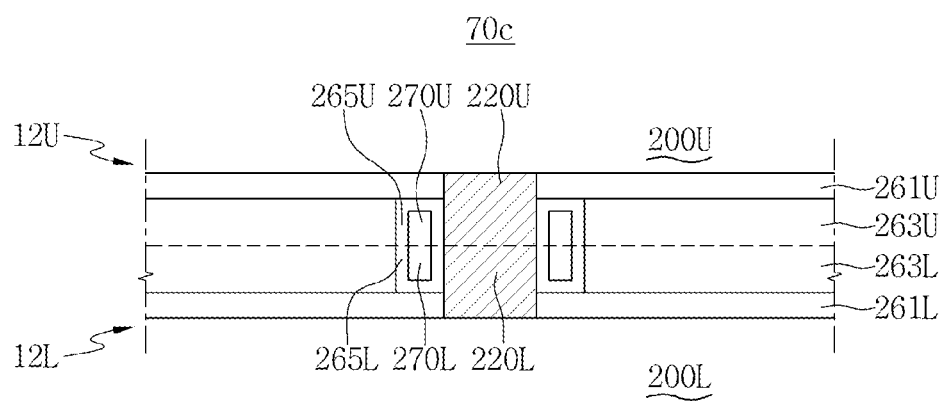
Figure 16D:
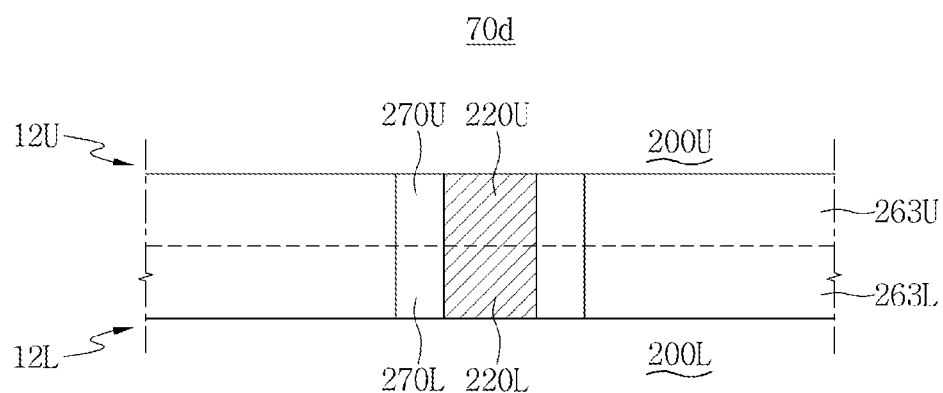

Referring further to FIGS. 16A, 16B, and 16C, the upper semiconductor device 12U may include an upper device lining layer 265U surrounding side and bottom surfaces of the upper device piezoelectric pattern 270U. The lower semiconductor device 12L may include a lower device lining layer 265L surrounding side and bottom surfaces of the lower device piezoelectric pattern 270L.

Referring further to FIGS. 16B, 16C, 16E, and 16F, the upper semiconductor device 12U may further include an upper device buffer insulating layer 261U between the upper device substrate 200U and the upper device passivation layer 263U. The lower semiconductor device 12L may further include a lower device buffer insulating layer 261L between the lower device substrate 200L and the lower device passivation layer 263L.

Referring to FIG. 16B, the upper device buffer insulating layer 261U may be in contact with a side surface of the upper device lining layer 265U. The lower device buffer insulating layer 261L may be in contact with a side surface of the lower device lining layer 265L.

Referring to FIG. 16C, the upper device buffer insulating layer 261U may be in contact with a bottom surface of the upper device lining layer 265U. The lower device buffer insulating layer 261L may be in contact with a bottom surface of the lower device lining layer 265L.

Figure 16E:
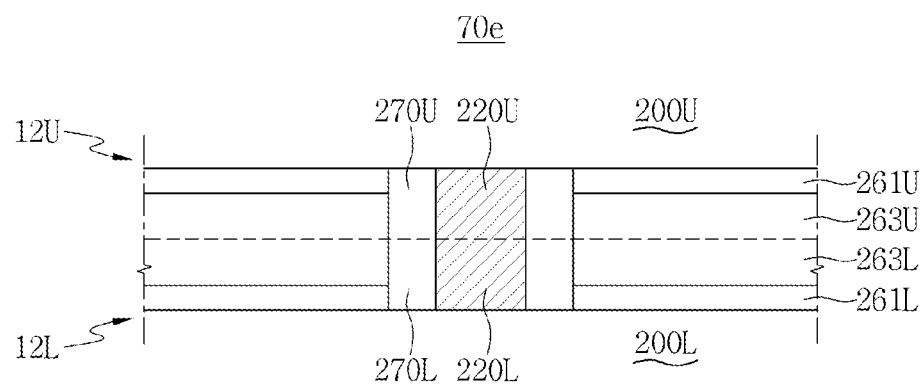

Referring to FIG. 16E, the upper device buffer insulating layer 261U may be in contact with a side surface of the upper device piezoelectric pattern 270U. The lower device buffer insulating layer 261L may be in contact with a side surface of the lower device piezoelectric pattern 270L.

Figure 16F:
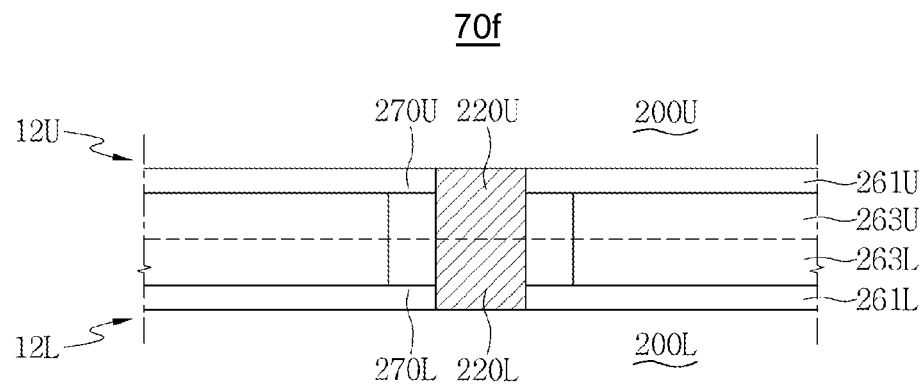

Referring to FIG. 16F, the upper device buffer insulating layer 261U may be in contact with a bottom surface of the upper device piezoelectric pattern 270U. The lower device buffer insulating layer 261L may be in contact with a bottom surface of the lower device piezoelectric pattern 270L.

The bonding structures 70a to 70f described in FIGS. 16A to 16F can be more specifically understood with reference to the various embodiments described in the specification and drawings.

FIGS. 17A to 17F are schematic views illustrating bonding structures 80a to 80f of metal lines 320U and 320L in accordance with various embodiments of the inventive concept.

Referring to FIGS. 17A to 17F, the bonding structures 80a to 80f in accordance with various embodiments of the inventive concept may include an upper semiconductor device 13U and a lower semiconductor device 13L, which can be bonded together. For example, an upper device metal pattern 320U of the upper semiconductor device 13U and a lower device metal pattern 320L of the lower semiconductor device 13L may be directly bonded together.

The upper semiconductor device 13U may include an upper device passivation layer 363U and an upper device metal pattern 320U, which are disposed on an upper device substrate 300U. The lower semiconductor device 13L may include a lower device passivation layer 363L, a lower device metal pattern 320L, and a lower device piezoelectric pattern 370L, which are disposed on a lower device substrate 300L.

The lower device piezoelectric pattern 370L surrounding the lower device metal pattern 320L may be formed between the lower device passivation layer 363L and the lower device metal pattern 320L.

Figure 17A:
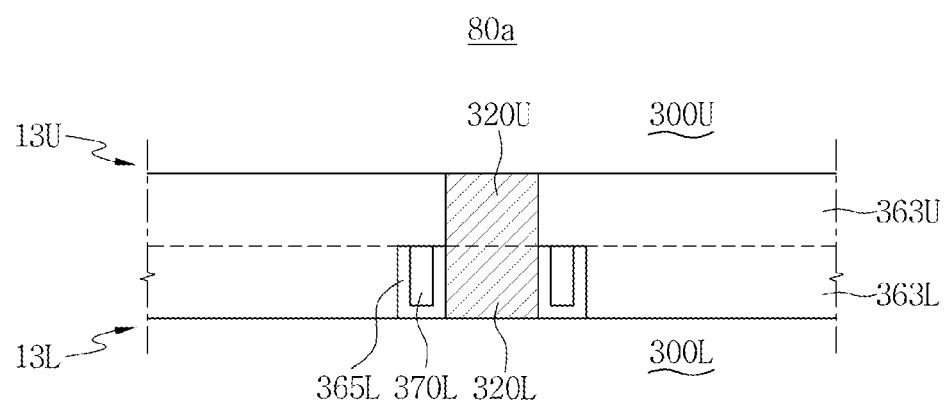
FIGS. 17A to 17F are schematic views illustrating bonding structures of metal lines in accordance with various embodiments of the inventive concept.
Figure 17B:
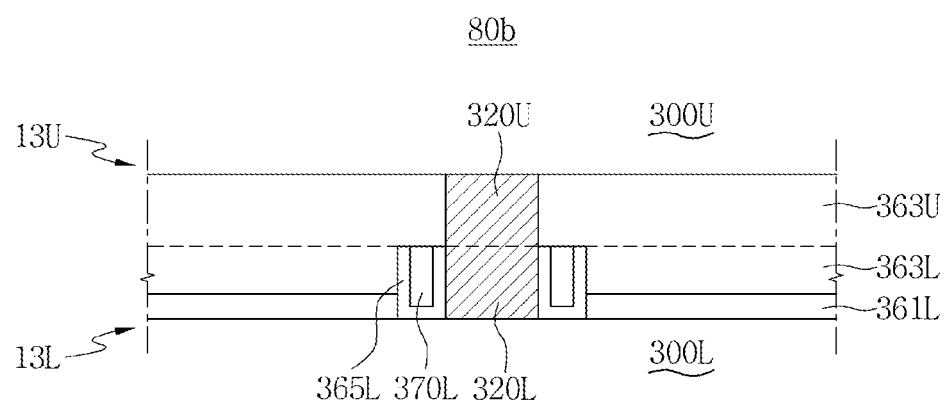
Figure 17C:
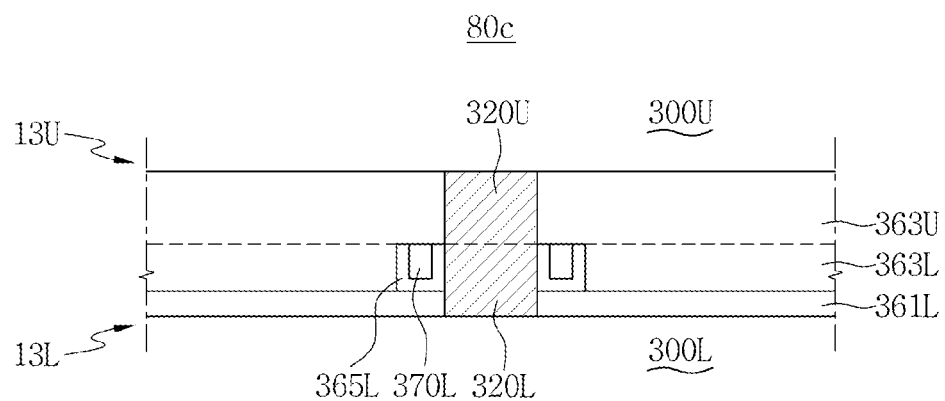
Figure 17D:
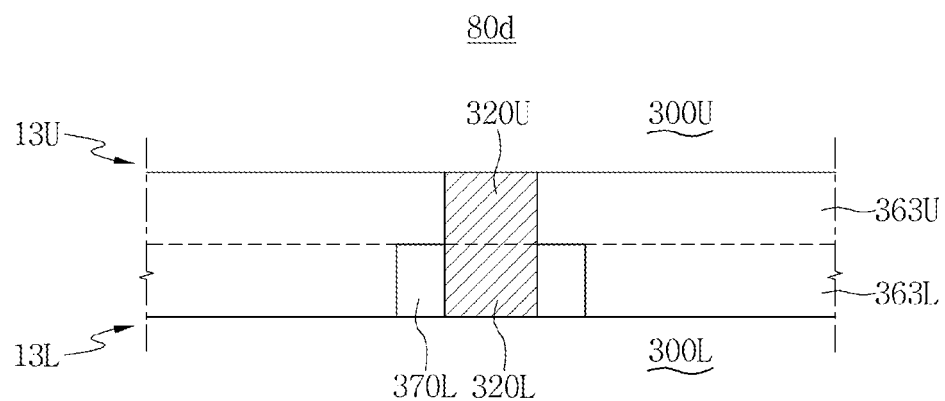

Referring further to FIGS. 17A, 17B, and 17C, the lower semiconductor device 13L may include a lower device lining layer 365L surrounding side and bottom surfaces of the lower device piezoelectric pattern 370L.

Referring further to FIGS. 17B, 17C, 17E, and 17F, the lower semiconductor device 13L may further include a lower device buffer insulating layer 361L between the lower device substrate 300L and the lower device passivation layer 363L.

Referring to FIG. 17B, the lower device buffer insulating layer 361L may be in contact with a side surface of the lower device lining layer 365L.

Referring to FIG. 17C, the lower device buffer insulating layer 361L may be in contact with a bottom surface of the lower device lining layer 365L.

Figure 17E:
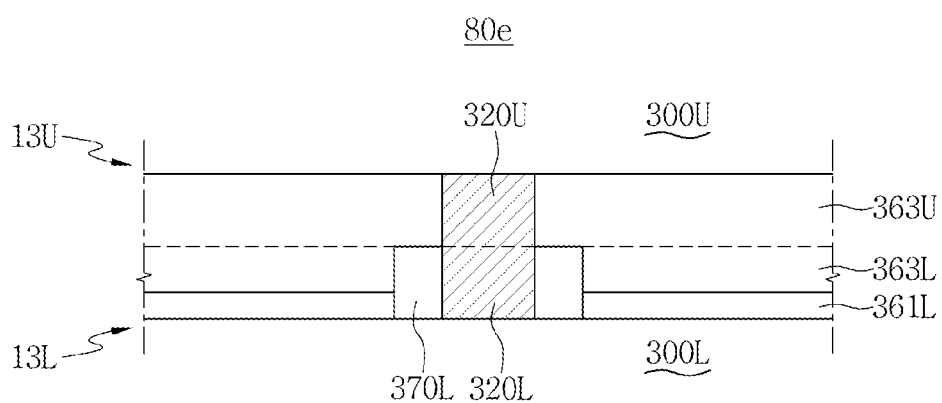

Referring to FIG. 17E, the lower device buffer insulating layer 361L may be in contact with the side surface of the lower device piezoelectric pattern 370L.

Figure 17F:
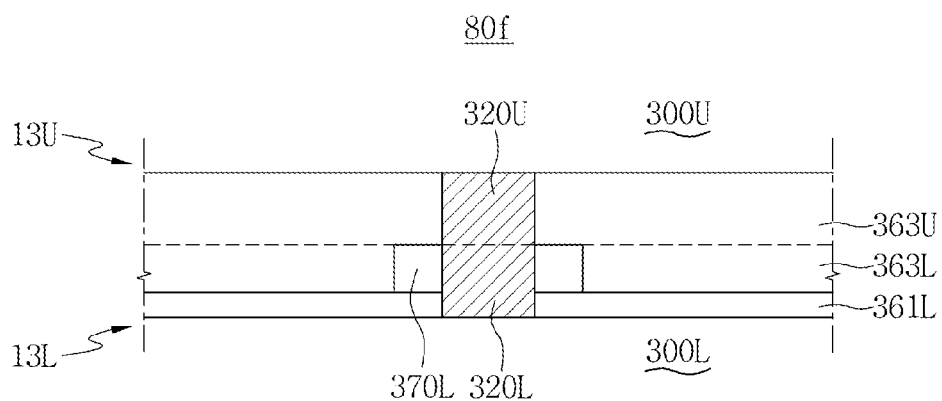

Referring to FIG. 17F, the lower device buffer insulating layer 361L may be in contact with the bottom surface of the lower device piezoelectric pattern 370L.

The bonding structures 80a to 80f described in FIGS. 17A to 17F can be more specifically understood with reference to the various embodiments described in the specification and drawings.

Figure 18A:
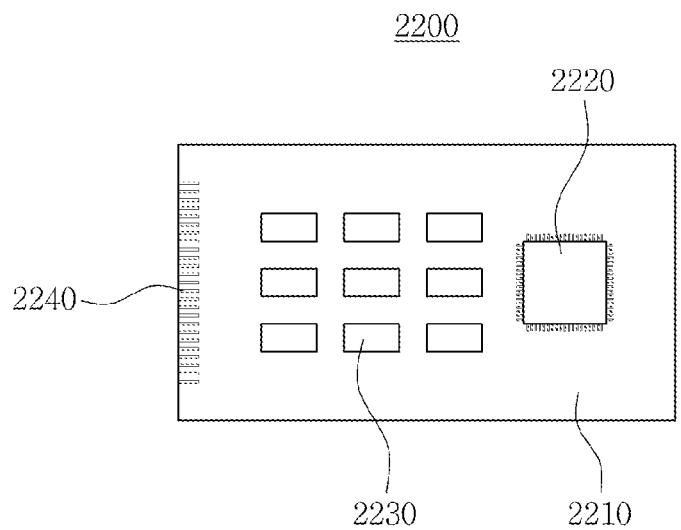
FIG. 18A is a schematic view illustrating a semiconductor module in accordance with an embodiment of the inventive concept.

FIG. 18A is a diagram showing a semiconductor module 2200 in accordance with an embodiment of the inventive concept. Referring to FIG. 18A, the semiconductor module 2200 in accordance with the embodiment of the inventive concept may include a processor 2220 installed on a semiconductor module substrate 2210, and semiconductor packages 2230. The processor 2220 or the semiconductor packages 2230 may include at least one of the semiconductor devices 10a to 10f, and 20a to 20c, or the bonding structures 30a to 30f, 40a to 40f, 50a to 50r, 60a and 60b, 70a to 70f, and 80a to 80f, in accordance with various embodiments of the inventive concept. Input/output terminals 2240 may be arranged on at least one side of the module substrate 2210.

Figure 18B:
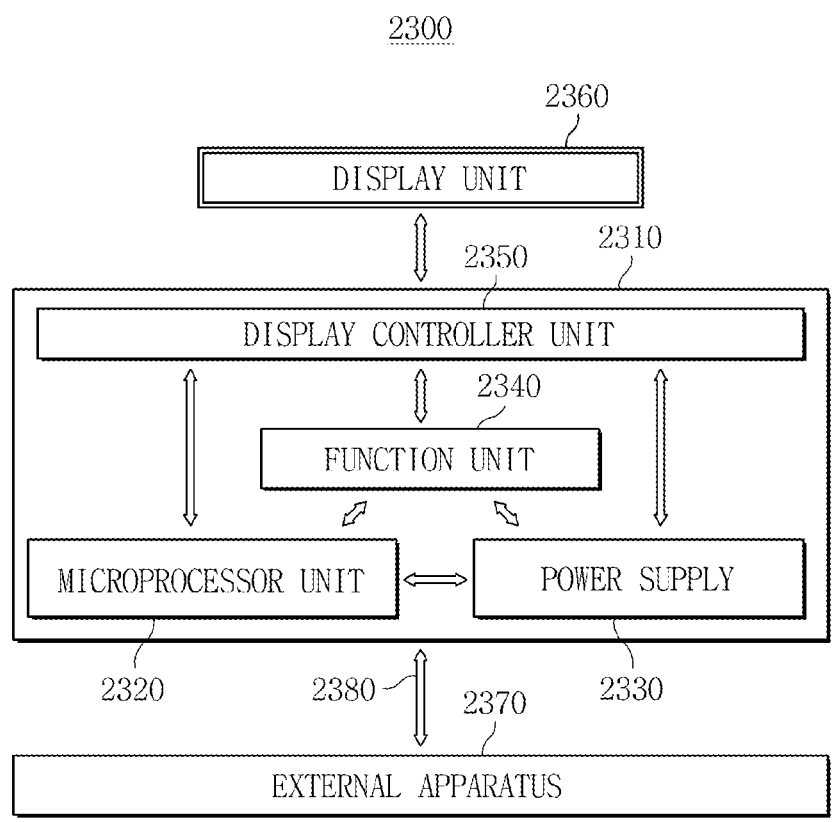
FIGS. 18B and 18C are block diagrams schematically showing electrical systems in accordance with embodiments of the inventive concept.
Figure 18C:
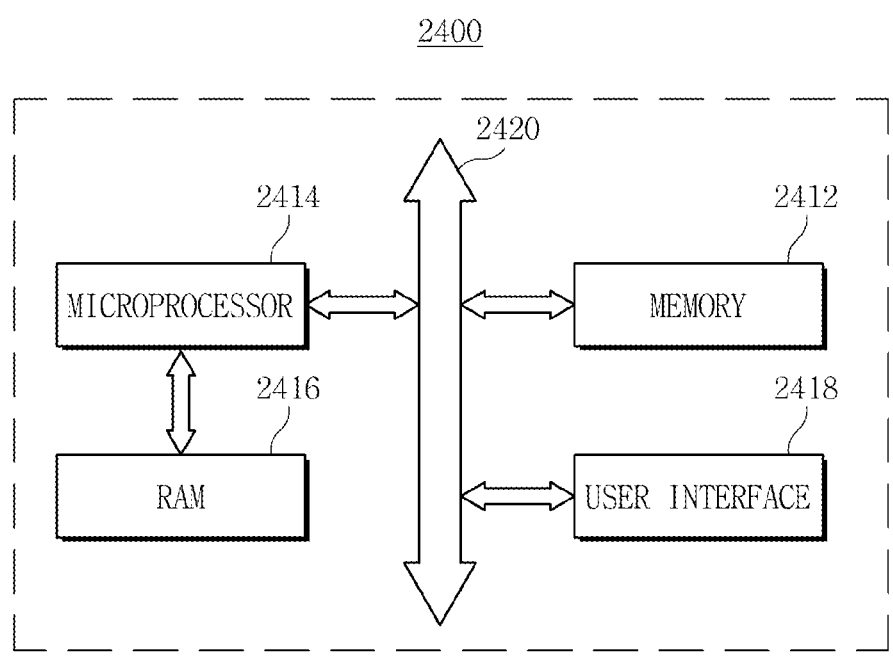

FIGS. 18B and 18C are block diagrams schematically showing electronic systems 2300 and 2400 in accordance with embodiments of the inventive concept. Referring to FIG. 18B, the electronic system 2300 in accordance with the embodiment of the inventive concept may include a body 2310, a display unit 2360, and an external apparatus 2370. The external apparatus 2370 may be connected to the body 2310 via an external conductor 2380 such as a bus, a wire, or the like.

The body 2310 may include a microprocessor unit 2320, a power supply 2330, a function unit 2340, and/or a display controller unit 2350. The body 2310 may include a system board or motherboard having a printed circuit board (PCB), and/or a case. The microprocessor unit 2320, the power supply 2330, the function unit 2340, and the display controller unit 2350 may be installed or arranged on an upper surface or an inside of the body 2310. A display unit 2360 may be arranged inside or outside of the body 2310.

The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch-screen. Accordingly, the display unit 2360 may have an input/output function.

The power supply 2330 may supply a current or voltage to the microprocessor unit 2320, the function unit 2340, and the display controller unit 2350, etc. The power supply 2330 may include a rechargeable battery, a socket for the battery, or a voltage/current converter.

The microprocessor unit 2320 may receive a voltage from the power supply 2330 to control the function unit 2340 and the display unit 2360. For example, the microprocessor unit 2320 may include a CPU or an application processor (AP).

The function unit 2340 may perform various functions. For example, the function unit 2340 may include a touch-pad, a touch-screen, a volatile/nonvolatile memory, a memory card controller, a camera, a light, an audio and video playback processor, a wireless transmission/reception antenna, a speaker, a microphone, a USB port, and other units having various functions.

The microprocessor unit 2320 or the function unit 2340 may include at least one of the semiconductor devices 10a to 10f, and 20a to 20c, or the bonding structures 30a to 30f, 40a to 40f, 50a to 50r, 60a and 60b, 70a to 70f, and 80a to 80f in accordance with various embodiments of the inventive concept.

Referring to FIG. 18C, the electronic system 2400 may include a microprocessor 2414, a memory system 2412, and a user interface 2418, which perform data communication using a bus 2420. The microprocessor 2414 may include a CPU or AP. The electronic system 2400 may further include a RAM 2416, which directly communicates with the microprocessor 2414. The microprocessor 2414 and/or the RAM 2416 can be assembled in a single package. The user interface 2418 may be used to input/output information to/from the electronic system 2400. For example, the user interface 2418 may include a touch-pad, a touch-screen, a keyboard, a scanner, a voice detector, a cathode ray tube (CRT) monitor, an LCD, an AMOLED, a plasma display panel (PDP), a printer, a light, or other various input/output devices. The memory system 2412 may store codes for operating the microprocessor 2414, data processed by the microprocessor 2414, or external input data. The memory system 2412 may include a memory controller, a hard-disk, or a solid state drive (SSD). The microprocessor 2414, the RAM 2416, and/or the memory system 2412 may include at least one of the semiconductor devices 10a to 10f, and 20a to 20c, or the bonding structures 30a to 30f, 40a to 40f, 50a to 50r, 60a and 60b, 70a to 70f, and 80a to 80f in accordance with various embodiments of the inventive concept.

Semiconductor devices in accordance with various embodiments of the inventive concept may include piezoelectric patterns that surround through-silicon-vias or pads for bonding. Accordingly, in the semiconductor devices in accordance with the embodiments of the inventive concept, a through-silicon-via and/or a pad can be directly bonded to another through-silicon-via and/or another pad by applying pressure only, and without performing a heat process. Since the semiconductor devices in accordance with the embodiments of the inventive concept can be connected or bonded to each other with no heat budget, performance and life of the semiconductor devices is maintained.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
    a substrate having a first surface and a second surface opposite to the first surface;
    a metal pattern protruding from the first surface of the substrate;
    an inter-layer insulating layer on the second surface of the substrate;
    a piezoelectric pattern covering a side surface of the metal pattern on the first surface of the substrate; and
    a passivation layer covering a side surface of the piezoelectric pattern on the first surface of the substrate.

2. The semiconductor device of claim 1, wherein the metal pattern includes a through-via structure vertically passing through the substrate.

3. The semiconductor device of claim 2, wherein the through-via structure comprises:
    a pillar-shaped through-via core;
    a through-via barrier layer surrounding the through-via core; and
    a through-via liner surrounding the through-via barrier layer,
    wherein the piezoelectric pattern is in contact with a side surface of the through-via core.

4. The semiconductor device of claim 2, wherein the piezoelectric pattern has a shape of a disk or ring surrounding the through-via structure in a top view.

5. The semiconductor device of claim 1, further comprising a pad structure formed on the inter-layer insulating layer,
    wherein the pad structure is electrically connected to the metal pattern.

6. The semiconductor device of claim 5, wherein the pad structure comprises:
    a mesa-type pad core; and
    a pad barrier layer surrounding a lower surface of the pad core.

7. The semiconductor device of claim 5, further comprising a via plug vertically passing through the inter-layer insulating layer and electrically connected to the pad structure.

8. The semiconductor device of claim 1, further comprising a lining layer surrounding side and bottom surfaces of the piezoelectric pattern.

9. The semiconductor device of claim 8, wherein the lining layer has a double disk, double ring, or concentric circle shape in a top view, and a U shape in a vertical cross-sectional view.

10. The semiconductor device of claim 8, further comprising a buffer insulating layer interposed between the first surface of the substrate and the passivation layer.

11. The semiconductor device of claim 8, further comprising a buffer insulating layer interposed between the first surface of the substrate and the passivation layer in contact with the lining layer surrounded the bottom surface of the piezoelectric pattern.

12. The semiconductor device of claim 1, wherein the piezoelectric pattern includes at least one of boron, phosphorus, or arsenic that is doped thereinside.

13. The semiconductor device of claim 1, wherein a top surface of the metal pattern and a top surface of the piezoelectric pattern are co-planar.

14. A semiconductor device, comprising:
    a substrate having a first surface and a second surface opposite to the first surface;
    a through-via structure vertically passing through the substrate, wherein an end portion of the through-via structure protrudes from the first surface of the substrate;
    a piezoelectric pattern disposed on the first surface of the substrate and covering a side surface of the end portion of the through-via structure;
    a first passivation layer disposed on the first surface of the substrate and covering a side surface of the piezoelectric pattern; and
    a second passivation layer disposed on the second surface of the substrate.

15. The semiconductor device of claim 14, further comprising a pad structure defined by the second passivation layer on the second surface of the substrate,
    wherein the pad structure is electrically connected to the through-via structure.

16. A semiconductor device, comprising:
    a passivation layer defining a metal pattern on a first surface of a substrate, wherein the metal pattern includes a through-via structure vertically passing through the substrate;
    an inter-layer insulating layer disposed on a second surface of the substrate; and
    a piezoelectric pattern formed between the metal pattern and the passivation layer on the first surface of the substrate,
    wherein the through-via structure comprises:
    a pillar-shaped through-via core;
    a through-via barrier layer surrounding the through-via core; and
    a through-via liner surrounding the through-via barrier layer, wherein the piezoelectric pattern is in contact with a first portion of a side surface of the through-via core and not in contact with a second portion of the side surface of the through-via core.

17. The semiconductor device of claim 16, wherein the piezoelectric pattern has a shape of a disk or ring surrounding the through-via structure in a top view.

18. The semiconductor device of claim 16, further comprising a pad structure formed on the inter-layer insulating layer, wherein the pad structure is electrically connected to the metal pattern.

19. The semiconductor device of claim 18, wherein the pad structure comprises:
    a mesa-type pad core; and
    a pad barrier layer surrounding a lower surface of the pad core.

20. The semiconductor device of claim 16, further comprising a lining layer surrounding side and bottom surfaces of the piezoelectric pattern.

* * * * *